(12) United States Patent
Ahmed et al.

(10) Patent No.: US 12,222,236 B2
(45) Date of Patent: Feb. 11, 2025

(54) SELF-POWERED WEIGH-IN-MOTION SYSTEM

(71) Applicants: Sara Ahmed, San Antonio, TX (US); Mohamadreza Khalili, Austin, TX (US); Athanassios Thomas Papagiannakis, Austin, TX (US); Gopal Vishwakarma, Austin, TX (US); Samer Dessouky, Helotes, TX (US)

(72) Inventors: Sara Ahmed, San Antonio, TX (US); Mohamadreza Khalili, Austin, TX (US); Athanassios Thomas Papagiannakis, Austin, TX (US); Gopal Vishwakarma, Austin, TX (US); Samer Dessouky, Helotes, TX (US)

(73) Assignee: BOARD OF REGENTS, THE UNIVERSITY OF TEXAS SYSTEM, Austin, TX (US)

( * ) Notice: Subject to any disclaimer, the term of this patent is extended or adjusted under 35 U.S.C. 154(b) by 321 days.

(21) Appl. No.: 17/859,429

(22) Filed: Jul. 7, 2022

(65) Prior Publication Data
US 2023/0024822 A1    Jan. 26, 2023

Related U.S. Application Data

(60) Provisional application No. 63/219,489, filed on Jul. 8, 2021.

(51) Int. Cl.
| | | |
|---|---|---|
| G01G 19/52 | (2006.01) | |
| G01G 3/13 | (2006.01) | |
| G01G 19/03 | (2006.01) | |
| H02N 2/18 | (2006.01) | |
| H10N 30/30 | (2023.01) | |
| H10N 30/50 | (2023.01) | |

(52) U.S. Cl.
CPC ............. *G01G 19/035* (2013.01); *G01G 3/13* (2013.01); *G01G 19/52* (2013.01); *H02N 2/181* (2013.01); *H10N 30/302* (2023.02); *H10N 30/50* (2023.02)

(58) Field of Classification Search
CPC ........ G01G 19/035; G01G 3/13; G01G 19/52; H02N 2/181; H02N 2/186; H10N 30/302; H10N 30/50; H10N 30/30; H10N 30/802
USPC .......................................................... 177/132
See application file for complete search history.

(56) References Cited

U.S. PATENT DOCUMENTS

| | | | | |
|---|---|---|---|---|
| 8,072,122 B2 * | 12/2011 | Gao | ...................... | H02N 2/183 310/330 |
| 8,781,715 B2 * | 7/2014 | Breed | .................... | G07C 5/008 455/500 |

(Continued)

*Primary Examiner* — Jacques M Saint Surin
(74) *Attorney, Agent, or Firm* — Thomas | Horstemeyer, LLP

(57) ABSTRACT

Aspects of self-powered weigh-in-motion systems and methods that utilize piezoelectric components for sensing load as well as powering data acquisition and analysis components. In one example, the weigh-in-motion system includes a number of piezoelectric stacks, each stack including a number of piezoelectric elements. Each stack includes one or more top or upper piezoelectric element that provides vehicle sensing data. Each stack also includes a set of piezoelectric elements used for energy harvesting. The sensing piezoelectric elements are connected to a data input of a microcontroller for vehicle classification, while the energy harvesting piezoelectric elements are connected to a power input of the microcontroller.

20 Claims, 11 Drawing Sheets

(56) References Cited

U.S. PATENT DOCUMENTS

| | | | |
|---|---|---|---|
| 9,014,953 B2* | 4/2015 | Breed | G08G 1/096783 |
| | | | 340/995.13 |
| 9,368,710 B2* | 6/2016 | Wang | H02N 2/186 |
| 2011/0127090 A1* | 6/2011 | Vijayaraghavan | G01G 19/03 |
| | | | 177/133 |

* cited by examiner

SELF-POWERED WEIGH-IN-MOTION SYSTEM

CROSS-REFERENCE TO RELATED APPLICATIONS

This application claims priority to and the benefit of U.S. Provisional Patent Application No. 63/219,489, filed on Jul. 8, 2021 and entitled "SELF-POWERED WEIGH-IN-MOTION SYSTEM," the entire contents of which, including appendixes filed therewith, are hereby incorporated herein by reference.

GOVERNMENT RIGHTS STATEMENT

This invention was made with government support under grant No. 69A3551747106 awarded by the United States of America Department of Transportation Research and Innovative Technology Administration. The government has certain rights in this invention.

BACKGROUND

Traffic data collection is an essential input to roadway infrastructure design and management. It encompasses the collection of a multitude of data elements ranging from simple traffic volume counts to vehicle classification and axle weighing. Automated axle load weighing systems measure individual axle loads and classify vehicles without stopping them. These systems are called weigh-in-motion systems. They are better suited for traffic data collection than the static weigh scales used for load enforcement, since the latter are by their function biased towards the heavier loaded vehicles. Weigh-in-motion data are widely used in pavement design, bridge design and traffic analysis, as well as in screening overloaded trucks for law enforcement purposes.

Despite that, there is seldom a sufficient amount of traffic load data, mainly because there is a limited number of permanent weigh-in-motion stations available. Site-specific traffic loads are a key input in obtaining realistic influence lines and transverse load distribution for designing new bridges and assessing existing ones. Site-specific weigh-in-motion data is also essential for the mechanistic-empirical pavement design (MEPD) that state agencies are in the process of implementing.

The data elements required include vehicle classification distributions (VCDs), monthly adjustment factors (MAFs) and normalized axle load spectra (NALDS). Considering the shortage of permanent weigh-in-motions, it is necessary to assemble this traffic input by combining limited site-specific traffic information with representative regional or national traffic data obtained from other permanently installed weigh-in-motion systems. This introduces a high uncertainty in the traffic load input, which could result in significant underestimation of the required structural thicknesses needed to accommodate the actual traffic loads. Clearly, more accurate site specific weigh-in-motion data and larger number of weigh-in-motion stations can improve traffic load estimation and reduce design uncertainties.

BRIEF DESCRIPTION OF THE DRAWINGS

For a more complete understanding of the embodiments and the advantages thereof, reference is now made to the following description, in conjunction with the accompanying figures briefly described as follows.

Figure 1:
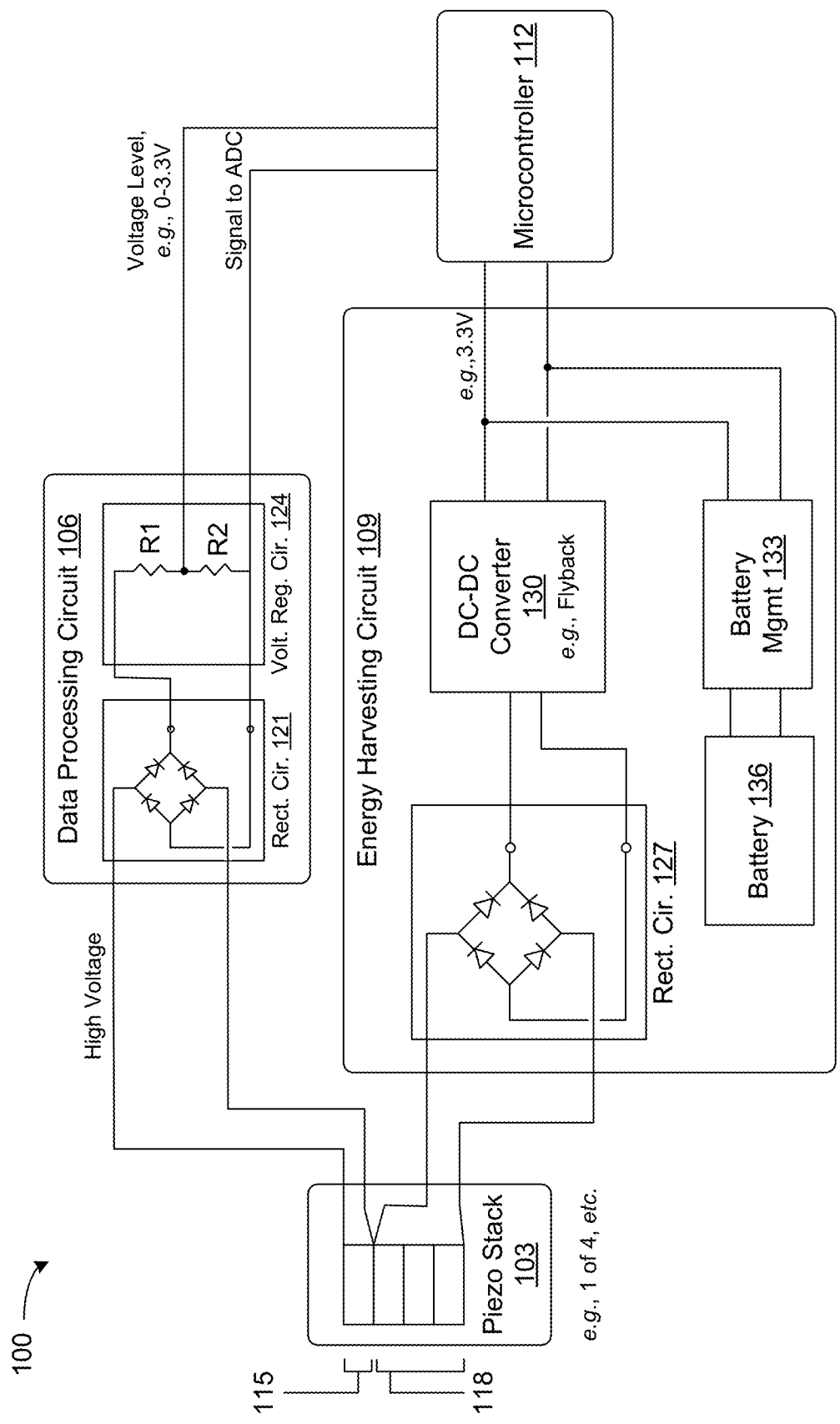
FIG. 1 illustrates an example of a self-powered weigh-in-motion system, according to the present disclosure.

The drawings illustrate only example embodiments and are therefore not to be considered limiting of the scope described herein, as other equally effective embodiments are within the scope and spirit of this disclosure. The elements and features shown in the drawings are not necessarily drawn to scale, emphasis instead being placed upon clearly illustrating the principles of the embodiments. Additionally, certain dimensions may be exaggerated to help visually convey certain principles. In the drawings, similar reference numerals between figures designate like or corresponding, but not necessarily the same, elements.

DETAILED DESCRIPTION

This disclosure describes aspects of self-powered weigh-in-motion systems and methods that utilize piezoelectric components for sensing load as well as powering data acquisition and analysis components. The embodiments are described in further detail by way of example with reference to the attached drawings. In the description, well known components, methods, and/or processing techniques can be omitted or briefly described so as not to obscure the embodiments. As used herein, the "present disclosure" refers to any one of the embodiments described herein and any equivalents. Furthermore, reference to various feature(s) of the "present embodiment" is not to suggest that all embodiments must include the referenced feature(s).

This disclosure describes the development of a weigh-in-motion system that utilizes piezoelectric elements for sensing load and powering itself. Sensing is done by four cylindrical piezoelectric elements 1-inch in diameter connected in parallel. Energy harvesting can be done by a set of four piezoelectric stacks, each consisting of 6 1-inch diameter piezoelectric elements arranged in alternating polarity and connected in parallel (i.e., this increases the amperage and decreases the voltage output). The top piezoelectric elements are for weigh in motion sensing, the bottom 5 are for energy harvesting. The top piezoelectric elements of each stack can be isolated or separate from the bottom piezoelectric elements, but parallel with the top piezoelectric elements of the other stacks. The bottom piezoelectric elements are in parallel in the stack, which can then also be parallel to the other bottom elements of the other stacks. The weigh-in-motion box enclosure can have a "shoe-box" design, with each corner of its upper plate supported by one of the piezoelectric/sensor combinations. The box was sized to capture loads on a one wheel path (i.e., 28 inches wide by 8 inches long).

A servo-hydraulic Universal Testing Machine (UTM) can be used to apply loads at various frequencies. An oscilloscope can be used for collecting the voltage output data. Preliminary testing showed that, given a loading frequency, the relationship between sensing voltage output and stress is linear, provided that the upper plate of the weigh-in-motion box is sufficiently stiff. Electromechanical models were fitted to describe the relationship between voltage output, load and loading frequency/vehicle speed. The model for the four piezoelectric sensing elements can be used to translate voltage output to load for sensing purposes, while the model for the four piezoelectric stacks connected in parallel was used for simulating the energy harvesting potential of the system.

Software can implement the electromechanical model fitted for sensing. It can output vehicle speed, axle load, number of axles and their spacing as well as vehicle classification according to the FWHA 13 vehicle scheme. The data can be output for each individual vehicle using the W-record format specified in the 2016 Traffic Monitoring Guide.

Special electric circuits can be used for conditioning/sensing the voltage output and for maximizing the power output for the weigh-in-motion systems described. Under heavy truck traffic the harvester can generate sufficient power to maintain operation of the microcontroller and recharging a backup battery. While certain values for wake up or turn on time are discussed, microcontrollers with faster wake up can shorten the time needed to process a vehicle and test the weigh-in-motion system.

The mechanisms described include aspects of a weigh-in-motion system that utilizes piezoelectric elements for sensing load and powering a microcontroller unit such as an ultra-low power microcontroller unit that serves as a data acquisition system. A system of one or more (e.g., 4) piezoelectric stacks can serve as the energy harvester, while load sensing can be accomplished via a set of one or more (e.g., 4) piezoelectric elements connected in parallel.

In one example, a piezoelectric stack can include 6 cylindrical piezoelectric elements of 1-inch in diameter placed on top of each other and connected in parallel by alternating their polarities. This allows increasing the amperage while decreasing the voltage output of the piezoelectric stacks that serve as the power energy harvesters (PEHs). On top of each piezoelectric stack, an electrically isolated cylindrical piezoelectric element of 1-inch diameter can be connected.

Four of these elements connected in parallel can serve as the load sensors. A weigh-in-motion box enclosure can include any appropriate design. For example, a "shoe-box" or rectangular prism design, with each corner of an upper plate supported by one of the piezoelectric/sensor combinations. The box can be sized to capture a particular wheel path of an appropriate measure (e.g., 28 inches wide by 8 inches long).

The system can include an microcontroller as indicated above. While any microcontroller can be used, microcontrollers can have varying data handling capabilities and power consumption requirements. In some examples, the microcontroller for the weigh-in-motion system can have a short "wake-up" time with a wake-up time short enough to enable powering on and vehicle sensing without the need for inductive loops commonly used by existing weigh-in-motion systems.

The common headway of 2 seconds can be allotted to separate vehicles. The advantage of a faster microcontroller can be to allow a higher sampling frequency of 2.5 kHz and to handle parallel processing, which shortens the time needed to process each vehicle. Within the 2 second time interval allotted to each vehicle, the time interval of loading pulses can enable computing loading frequency/vehicle speed, and the time interval between pulses can enable computing the axle spacing. The amplitude of pulses and the loading frequency are input into the electromechanical model of the sensing elements to predict load. Special electric circuits used in the system can maximize the power output and condition/sense the voltage output.

Electromechanical models can be utilized to describe the relationship between voltage output, load and loading frequency/vehicle speed. A servo-hydraulic Universal Testing Machine (UTM) can be used to apply loads at various frequencies. An oscilloscope can be used for collecting the voltage output data. The model for the four piezoelectric stacks connected in parallel can be used for simulating the energy harvesting potential of the system, while the model for piezoelectric elements can be used to translate voltage output to load for sensing purposes.

System software and other executable instructions executed by the microcontroller or another computing device of the system can implement the electromechanical model fitted for sensing. The software can generate and output vehicle speed, axle load, number of axles and their spacing as well as vehicle classification according to the FWHA 13 vehicle scheme. The data can be output for each individual vehicle using the W-record format specified in the 2016 Traffic Monitoring Guide. The software can be implemented in Matlab®, C language, and any appropriate programming language that can be loaded and stored in a memory device integrated with or accessible to the microcontroller or another computing device. Vehicle speed and classification predictions can be accurately generated and stored and transmitted, for example, to a physical device connected to the system over a network such as a wired or wireless network. Axle load predictions are precise and in general within the tolerance limits prescribed by the ASTM standard E1318.

Moving on to FIG. 1, shown is a self-powered weigh-in-motion system 100. The weigh-in-motion system 100 can include a piezoelectric stack 103, a vehicle sensing data processing circuit 106, an energy harvesting circuit 109, and a microcontroller 112 or another computing device.

The piezoelectric stack 103 can be located, for example, one at each corner and potentially other locations relative to a top plate of the self-powered weigh-in-motion system 100. Each piezoelectric stack 103 can include a sensing piezoelectric component 115 and an energy harvesting piezoelectric component 118 for energy harvesting purposes. The sensing piezoelectric component 115 of each of the piezoelectric stacks 103 can include one or more piezoelectric disks or elements. If there are multiple elements of the sensing piezoelectric component 115, they can be connected in parallel with each other, and in all examples they can be electrically separate from the energy harvesting piezoelectric component 118.

Electrically separate elements can indicate that a voltage or another electrical output from the sensing piezoelectric component 115 is uncombined with the voltage or another electrical output from the energy harvesting piezoelectric component 118. The energy harvesting piezoelectric components 118 of each of the piezoelectric stacks 103 can be connected in parallel and can be electrically separate from the sensing piezoelectric components 115.

The vehicle sensing data processing circuit 106 can include a rectifier circuit 121 and a voltage divider and/or voltage regulation circuit 124. The rectifier circuit 121 can include a passive rectifier circuit such as a diode rectifier circuit. The vehicle sensing data processing circuit 106 can receive a relatively high voltage vehicle sensing signal from the sensing piezoelectric component 115. The rectifier circuit 121 can rectify the voltage vehicle sensing signal, provide it to the voltage divider and/or voltage regulation circuit 124, and output vehicle sensing data to the microcontroller 112 at a voltage level appropriate for input to the microcontroller 112. For example, 0-3.3V, 0-5V, or another appropriate level. The microcontroller 112 can include or utilize an analog to digital converter (ADC) module or component of the system, and the regulated voltage can be used to create a digital value by the ADC.

The energy harvesting circuit 109 can include a rectifier circuit 127, a DC-to-DC converter 130, a battery management component 133 and a battery 136. The rectifier circuit 127 can include a passive rectifier circuit such as a diode rectifier circuit. The DC-to-DC converter 130 can include a flyback DC-to-DC converter or another appropriate DC-to-DC converter circuit.

The energy harvesting circuit 109 can receive electrical energy from the energy harvesting piezoelectric component 118. The rectifier circuit 127 can rectify the electrical energy, provide it to the DC-to-DC converter 130, which can output an appropriate DC power with an appropriate voltage to power the microcontroller 112. The DC-to-DC converter 130 can also provide the DC power to the battery management component 133, which can appropriately charge and provide power management and lifecycle management for the battery 136.

The rectifiers discussed can reverse the sign of the negative part of loading pulses, while the voltage divider scales down the voltage output to the 0 to 3.3 Volt or other range suitable for input into the analog ports of the MCU. The energy harvesting circuit can include the four stacked energy harvesting piezoelectric components 118 of the piezoelectric stacks 103, connected in parallel, which in effect adds the currents produced by each of them. Their output can be connected to a diode rectifier and a smoothing capacitor to convert their AC signal output to a DC signal. The DC voltage can be then scaled down using an isolated flyback DC-to-DC converter 130 with a customized transformer winding to match the internal impedance of the energy harvesting piezoelectric components 118 and control the output voltage to a level suitable for powering the microcontroller 112 (e.g., 3.3 V).

In parallel, the self-powered weigh-in-motion system 100 can include a rechargeable battery system that includes the battery management component 133 and the battery 136. This can power the microcontroller 112 when there is insufficient energy harvested from the traffic. Conversely, when there is excess energy harvested, it recharges the battery 136.

Figure 2:
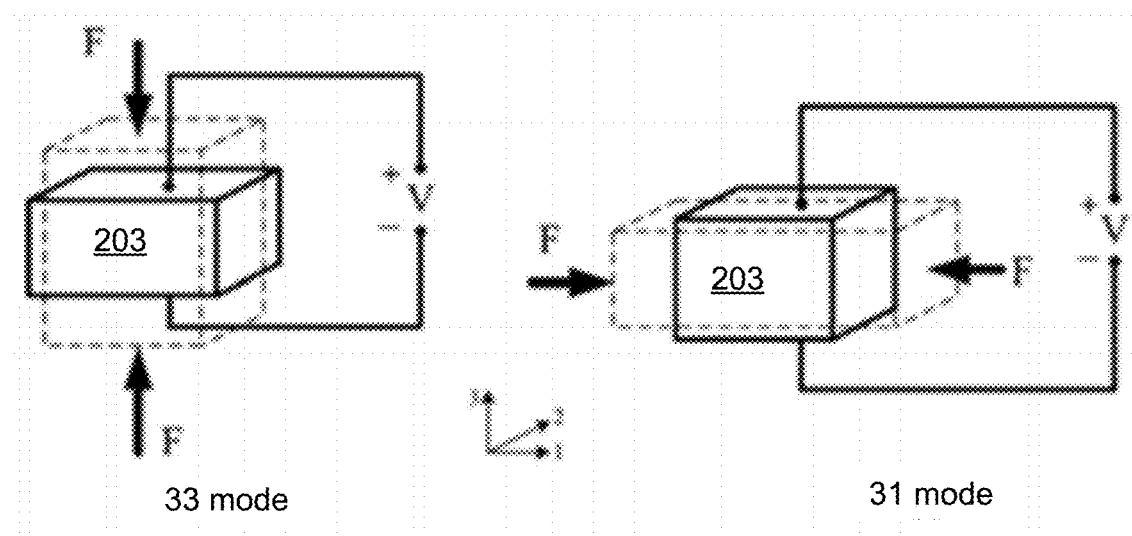
FIG. 2 illustrates examples of the operation of piezoelectric devices for a self-powered weigh-in-motion system, according to the present disclosure.

FIG. 2 shows examples of the operation of piezoelectric devices 203 of the self-powered weigh-in-motion system 100. The piezoelectric devices 203 can include the sensing piezoelectric component 115 and the energy harvesting piezoelectric component 118. The figure shows that the piezoelectric devices 203 of the self-powered weigh-in-motion system 100 can operate in "33" or "31" modes. The example on the left illustrates 33 mode, while the example on the right illustrates 31 mode.

The mechanical to electrical energy conversion efficiency of the "33" mode can be 3 to 5 times higher than that of the "31" mode. A piezoelectric structure in "33" mode can produce twice the electrical charges compared to one with the same dimensions in "31" mode. However, the stiffness of piezoelectric materials can be higher in the poling direction. As a result, energy harvesting applications that rely on vibration can use the "31" mode where loads are low.

Figure 3A:
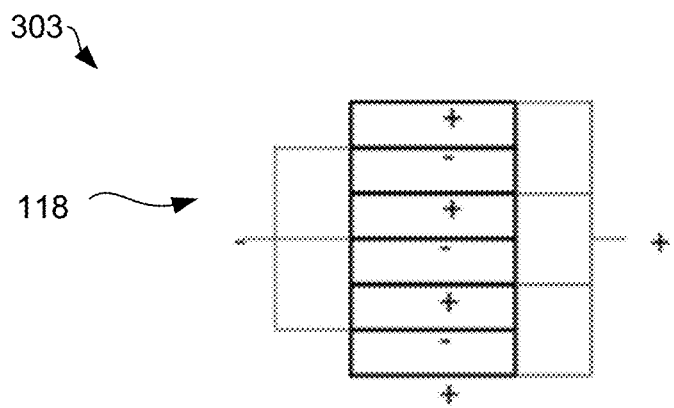
FIGS. 3A-3C illustrate examples of piezoelectric circuits for a self-powered weigh-in-motion system, according to the present disclosure.

FIG. 3A shows an example of piezoelectric disks 303 that are assembled into a stack and connected in parallel. This arrangement can be used for the piezoelectric stack 103. The piezoelectric disks 303 can be assembled in reverse polarity forming a column or stack and connected in parallel as shown. For example, the first piezoelectric disk at the top can have a positive node or connection at its top, and a negative node or connection at its bottom.

The second piezoelectric disk down can have its negative node toward the top and adjacent to the negative node of the first piezoelectric disk; the second piezoelectric disk down can have its positive node downward and adjacent to a positive node of a third piezoelectric disk, and so on. In other words, the polarity orientation can alternate for adjacent piezoelectric disks of the stack. This arrangement can reduce the voltage output of the stack and reduces the matching impedance needed for maximizing power output.

Electrical connectors can be fabricated from 3 mils (0.003") or another size of copper strips sandwiched between the piezoelectric disks. These connectors can be soldered to the piezoelectric disks using 2 mils or another size of indium foils. In order to provide electrical insulation, for the most top and bottom electrodes a copper sheet coated with a layer of polyimide tape with HN film and silicone adhesive, such as Kapton® or a similar material can be used as electrodes. In order to provide proper bonding between the copper and Indium during the soldering process, the copper can be electroplated with Indium. The copper sheets and the polyimide tape coated copper sheets can be formed as work pieces using a CNC machine. The final electrodes which go into the stack can be made by cutting these work pieces into proper shapes.

Electroplating can clean the copper work pieces from their surface pollutants such as grease and oxides. For this purpose, an alkaline cleaner (e.g., METKLEEN 2110) can be used to clean the grease and an acidic cleaner (e.g., Citranox) can be used to remove the oxides. Work pieces can be placed in a tank containing the alkaline cleaner diluted to 10% at a temperature of 60° C. for 20 minutes or an appropriate time. After cleaning with an alkaline cleaner and washing the pieces with DI water, they can be placed in a tank containing 2% Citranox for around 30 minutes.

When plating at a rate of 20 Amps/ft², it can take one hour to accumulate 1.4 mils of electroplated Indium thickness on the work pieces. Accordingly, a desired thickness can be obtained. Each copper work piece can have an area of $\square \cdot 1^2/4$ in², hence:

$$A_{1-side} = 5\frac{\pi * 1^2}{4} = 3.93 \text{ in}^2 = .027 \text{ ft}^2$$

$$A_{2-side} = .027 * 2 = 0.055 \text{ ft}^2$$

$$I = 0.055 * 20 = 1.09 \text{ Amps}$$

So, the electroplating can run for 1 hour with a current of 1 Amp for achieving 1.4 mils. For the pieces of copper at the ends of the stack (i.e., those that had polyimide tape on 1 side), the current can be set to 0.4 Amps to reach the same or similar thickness.

As described earlier, 2 mils of Indium foils can be cut into circles with diameters matching the diameter of the piezoelectric disks (e.g., 1 inch) then placed between the electrodes and the piezoelectric disks. Then, the stack can be placed in the oven at a temperature of 175° C. for a duration of 5 hours to effect soldering.

PEH testing can be carried out using a Universal Testing Machine (UTM) with a 25 kN static load capacity. This is a servo-hydraulic system commonly used for material testing. It is capable of applying dynamic loads at frequencies limited by the amplitude of the load selected. Hence, at high loads, the frequencies achieved (i.e., actual) are typically lower than the ones dialed (i.e., nominal). Multiple types of loading functions can be used for testing the piezoelectric. One of the loading types can include continuous sinusoidal loading, which was maintained compressive by selecting a minimum value of 0.2 kN. A maximum peak value of 11 kN can result in some examples. An actual load can result in this amplitude and frequency applied on one stack and the corresponding actuator displacement.

Another loading type can include pulsating loading. Pulsating loading can include half a sine wave followed by a rest period. An example pulse can have a frequency of 10 Hz and peak values of 11 kN and minimum of 0.2 kN. A rest period between pulses can be 0.9 sec. Piezoelectric voltage output measurements can be utilized in characterizing the performance of PEHs. The data acquisition (DAQ) system used for monitoring the electrical output of the piezoelectric stacks 103 can be important because its internal impedance affects the electrical quantities being measured.

Piezoelectric stack measurements can also use an oscilloscope (Tektronix DPO 4054) and a voltage probe with 500× attenuation rate. The oscilloscope can be selected to include a very high internal impedance (1MΩ)), which can provide electrical measurements under open-circuit conditions.

Individual piezoelectric disks can be tested by measuring a sinusoidal mechanical load with nominal peak values of 1.1 kN at frequencies ranging from 2.5 Hz to 62 Hz. The tests indicate that similar vehicular loads can be tested accurately. Each disk can be directly connected to the oscilloscope. Isolated piezoelectric disks can be compared to the output of the piezoelectric.

The oscilloscope can output voltage statistics that include the root mean square (RMS) ($V_{rms}$), the maximum ($V_{max}$) and the minimum ($V_{min}$) values of the signal over the time window captured. The amplitude of the voltage signal can be estimated by two methods, depending on the type of loading: Multiplying the $V_{rms}$ reading by $\sqrt{2}$, assuming a sinusoidal shape for the output voltage signal or, Computing the voltage amplitude using ($V_{max}-V_{min}$)/2.

While both methods are possible for continuous sinusoidal loading, while only the second method is used for pulsating loading. The limitation of the latter can be that there is a small variation in instantaneous $V_{max}$ and $V_{min}$ readings as opposed to the more stable $V_{rms}$ statistic.

An output signal can be monitored for different electrical loads dialed in via the external variable resistor. The voltage amplitude was computed based on the two methods discussed earlier. Computing the signal amplitude based on $V_{rms}$ readings leads to slightly lower amplitudes but overall, the resulting shapes of the plotted curves are similar.

This difference can result from the readings of $V_{max}$ and $V_{min}$ from the oscilloscope showing the maximum value and the minimum value as opposed to the $V_{rms}$ that is computed based on all the data points in the signal. Another reason is that the min-max approach may include oscilloscope noise. Overall, the differences between these two methods of computing voltage amplitude appear to be large for low external impedance and vice versa.

The RMS power output of the piezoelectric disk can be calculated using $P=V_{rms}^2/R_L$ by measuring the voltage across an external resistance $R_L$. At higher frequencies, the power output of a piezoelectric disk depends on the external resistance used. This power increases for piezoelectric stacks 103 built by six of these disks as will be shown and discussed later.

As indicated above, a top piezoelectric disk or disks within a piezoelectric stack 103 can be used as a sensing piezoelectric component 115 for vehicular load sensing purposes, while retaining the lower 5 elements as an energy harvesting piezoelectric component 118 for energy harvesting purposes. The calculated loads from each sensing piezoelectric component 115 can be added and multiplied by two to get the whole axle load in an example where the system is designed to cover a one wheel path (potentially multiple wheels if there are multiple wheels on a single side of the axle). In this scenario, the system can bear half of the axle load.

Figure 3B:
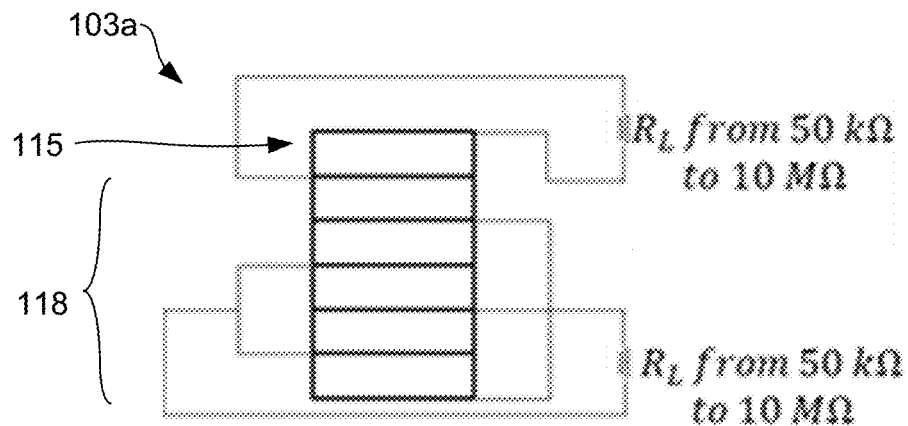

FIG. 3B shows an example of piezoelectric disks that are assembled into an example piezoelectric stack 103a that includes a sensing piezoelectric component 115 and an energy harvesting piezoelectric component 118 for energy harvesting purposes. In this example, the sensing piezoelectric component 115 is shown to include a single piezoelectric disk or element. Other examples can include multiple stacked elements.

In this example, the sensing piezoelectric component 115 lacks a rectifier circuit 121 and is provided directly to a load such as an analog to digital microcontroller input of a microcontroller 112. This can be represented as a resistive load $R_L$. The energy harvesting piezoelectric component 118 also lacks a rectifier circuit 127 and is provided directly to a resistive load such as an AC-to-DC converter, or directly to a power input of the microcontroller 112, and/or to a battery management component 133 that connects to a battery 136.

Figure 3C:
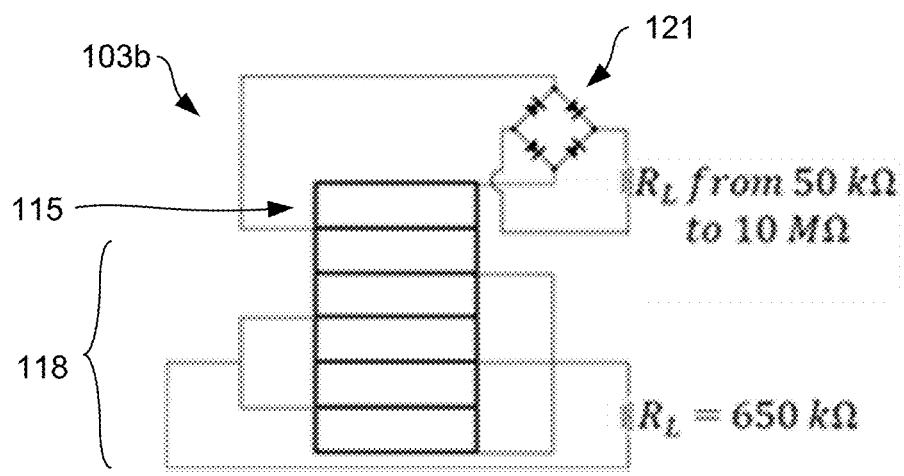

FIG. 3C shows an example of piezoelectric disks that are assembled into an example piezoelectric stack 103b that includes a sensing piezoelectric component 115 and an energy harvesting piezoelectric component 118 for energy harvesting purposes. In this example, the sensing piezoelectric component 115 is shown to include a single piezoelectric disk or element. Other examples can include multiple stacked elements.

In this example, the sensing piezoelectric component 115 includes a rectifier circuit 121, and a rectifier output is provided directly to a resistive load such as an analog to digital microcontroller input of a microcontroller 112. This can be represented as a resistive load $R_L$. The energy harvesting piezoelectric component 118 lacks a rectifier circuit 121 and is provided directly to a resistive load such as an AC-to-DC converter, or directly to a power input of the microcontroller 112, and/or to a battery management component 133 that connects to a battery 136. Other examples include the rectifier circuit 127.

Figure 4:
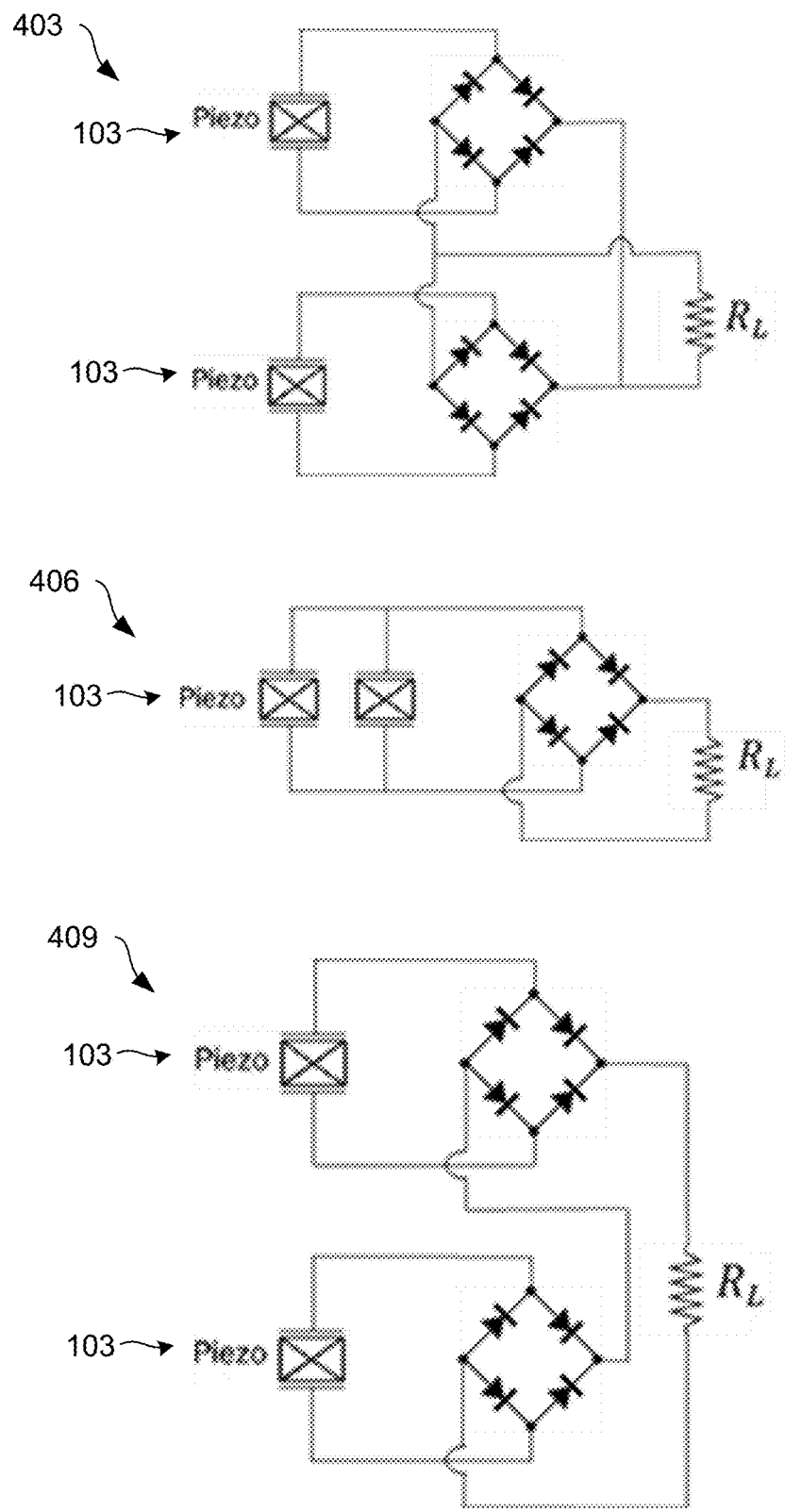
FIG. 4 illustrates examples of piezoelectric circuits for a self-powered weigh-in-motion system, according to the present disclosure.

FIG. 4 shows examples of piezoelectric circuits 403, 406, and 409 that can be used for a self-powered weigh-in-motion system 100. The piezoelectric circuit 403 shows an example where each piezoelectric stack 103 is connected to a corresponding rectifier, and multiple rectified piezoelectric stacks 103 are connected in parallel. The piezoelectric circuit 406 shows an example where multiple piezoelectric stacks 103 are connected in parallel, and the parallel set of piezoelectric stacks 103 are connected to a single rectifier circuit. The piezoelectric circuit 409 shows an example where each piezoelectric stack 103 is connected to a corresponding rectifier, and multiple rectified piezoelectric stacks 103 are connected in series. In yet another example, multiple piezoelectric stacks 103 can be connected in series, and the series set of piezoelectric stacks 103 can be connected to a single rectifier circuit.

TABLE 1

| Frequency [Hz] | Matching Impedance (MΩ) | | |
|---|---|---|---|
| | One Stack | Two Stacks connected in parallel | Ratio |
| 2.5 | 7 | 3.5 | 0.500 |
| 5 | 4 | 3 | 0.750 |
| 10 | 3 | 1.5 | 0.500 |
| 20 | 1.5 | 0.850 | 0.567 |
| 30 | 1 | 0.650 | 0.650 |
| 40 | 0.850 | 0.450 | 0.529 |
| 62 | 0.450 | 0.250 | 0.556 |

The two-rectifier design of piezoelectric circuit 403 can generate slightly higher voltage than piezoelectric circuit 406. Experimentation shows that the rectifiers do not significantly affect the power output. Furthermore, the output of multiple piezoelectric stacks 103 connected in parallel is not affected by the force distribution between them.

Table 1 shows an example of experimentally obtained matching impedances of one versus two piezoelectric stacks 103 connected in parallel. Table 1 shows that matching impedance is lower for two piezoelectric stacks 103 connected in parallel, as compared to a single piezoelectric stack 103.

An alternative connection arrangement is for piezoelectric stacks 103 to be connected in series, as shown for the piezoelectric circuit 409. In order to compare the output of the parallel and series connection, two sets of tests were conducted on two piezoelectric stacks, one without a rectifier and another with a rectifier.

The parallel connection can produce higher voltage and power output. A comparison is summarized in Table 2.

TABLE 2

| Frequency [Hz] | Max Power [mW] | | Matching Impedance [MΩ] | |
|---|---|---|---|---|
| | Series | Parallel | Series | Parallel |
| 10 | 1.45 | 2.63 | 4 | 1.5 |
| 62 | 20.4 | 22.5 | 1 | 0.25 |

Connecting the piezoelectric stacks 103 in parallel causes combined voltage to be the sum of the voltages of the individual piezoelectric, which corresponds directly to the summation of the forces on the piezoelectric. This solves the problem of the slight variations of load split on the piezoelectric stacks 103 caused by their slight differences in height. As Table 2 suggests, the parallel connection reduces the impedance of the system and hence, reduces the magnitude of the external matching impedance required.

Any number of piezoelectric stacks 103 can be connected in parallel and tested under different mechanical load amplitudes such as 1.1, 2.2 and 3.3 kN and frequencies of 10 Hz and 62 Hz and other frequencies representing low and high frequencies. This can evaluate the effect of the number of piezoelectric stacks 103 on the harvested power. Three piezoelectric stacks 103 connected in parallel behave similarly to the one piezoelectric stack 103. The output voltage of the three parallel piezoelectric stacks 103 increases linearly with force amplitude and can be expressed as a linear relationship. Although the relationship can be linear, its slope is slightly lower than that corresponding to a single piezoelectric stack 103.

Increasing the number of piezoelectric stacks 103 while keeping the same force amplitude, results in a lower power output and the only benefit being is a lower matching impedance. The matching impedance of three piezoelectric stacks 103 is roughly equal to one third of an individual stack, confirming earlier findings. Table 2 plots the maximum power output versus the number of piezoelectric stacks 103. The maximum power decreases linearly with the number of piezoelectric stacks 103. The reason is that the power output from a piezoelectric element is proportional to the square of the stress applied.

At higher loading frequencies (i.e., over about 15 Hz), the impedance of a set of 4 parallel piezoelectric stacks 103 can be approximately 25% of the impedance of the single piezoelectric stack 103. The additive effect in connecting four piezoelectric stacks 103 can be approximately linear in power, but the rate of increase is higher for 62 Hz.

Generally, laboratory testing shows that piezoelectric elements for sensing and energy harvesting can follow these general principles:
  Given a loading frequency, the relationship between voltage output and stress can be linear.
  The loading frequency affects the slope of the voltage output versus stress.
  The piezoelectric stack output power can be maximized when the external impedance matches the internal system impedance.
  The piezoelectric elements to be used for load sensing can be electrically isolated from the piezoelectrics for energy harvesting.
  The in parallel connection can have higher voltage and power under the same loading conditions, reduced matching impedances and direct summation of the sensing voltages, which leads to direct summation of the forces shared amongst the piezoelectric stacks 103 supporting the tire loads.

The selected rectifier configuration can include connecting one rectifier to each piezoelectric stack 103 before connecting them in parallel.

Figure 5:
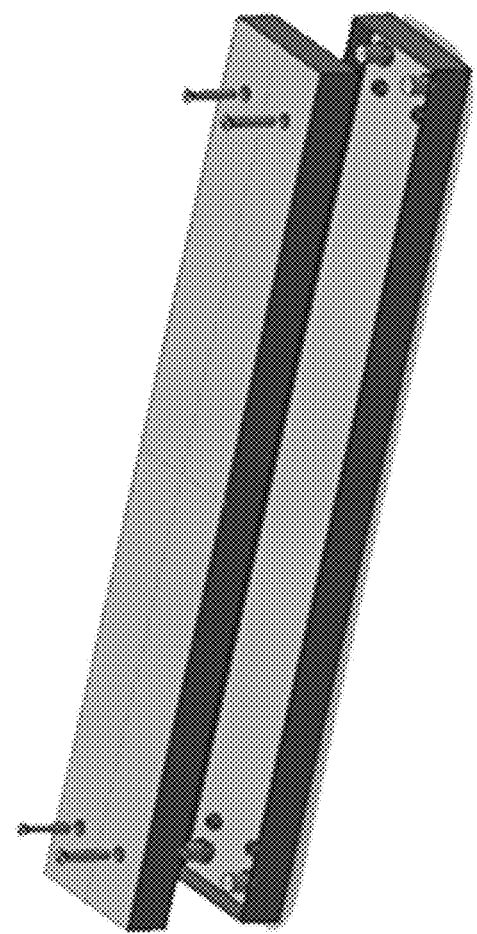
FIG. 5 illustrates an example of an enclosure for a self-powered weigh-in-motion system, according to the present disclosure.

FIG. 5 illustrates an example of a weigh-in-motion enclosure 503 for a self-powered weigh-in-motion system 100. The weigh-in-motion enclosure 503 can be a box or another shape of enclosure made of steel or another rigid and durable material. For example, a steel box made of AISI 1018 steel (i.e., yield stress of 53.7 ksi) with a top plate supported in each corner by a piezoelectric stack 103.

Figure 6:
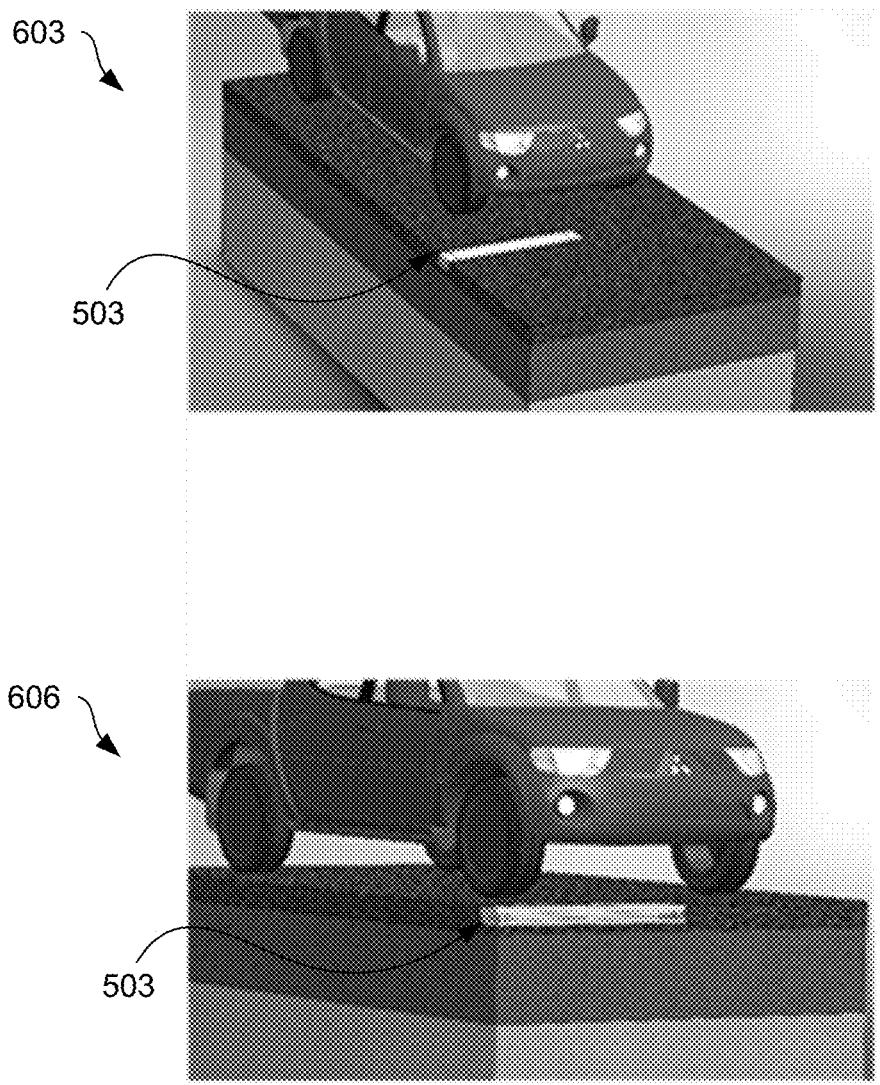
FIG. 6 illustrates an example of an installation of a self-powered weigh-in-motion system, according to the present disclosure.

FIG. 6 shows two isometric views 603 and 606 of an installation of a self-powered weigh-in-motion system 100 and weigh-in-motion enclosure 503 within a roadway or another pavement surface. The weigh-in-motion enclosure 503 can be embedded into the roadway, weigh station, or another pavement flush with the pavement surface.

The weigh-in-motion enclosure 503 dimensions and materials can be selected to safely carry the entire load of half a truck axle (i.e., 1 wheel path) and transmit it to the piezoelectric stack 103. For example, the weigh-in-motion enclosure 503 can be designed to support the heaviest one half axle of a set of all vehicles that are to be classified by the powered weigh-in-motion system 100.

Lateral placement of the weigh-in-motion enclosure 503 in the driving lane or another pavement surface can be identified by well-established vehicle weaving and travel patterns. A width of the weigh-in-motion enclosure 503 can be designed to be wide enough to capture all of a set of identified vehicle weaving and travel patterns for the widest vehicle path (e.g., dual truck/trailer wheels).

Figure 7:
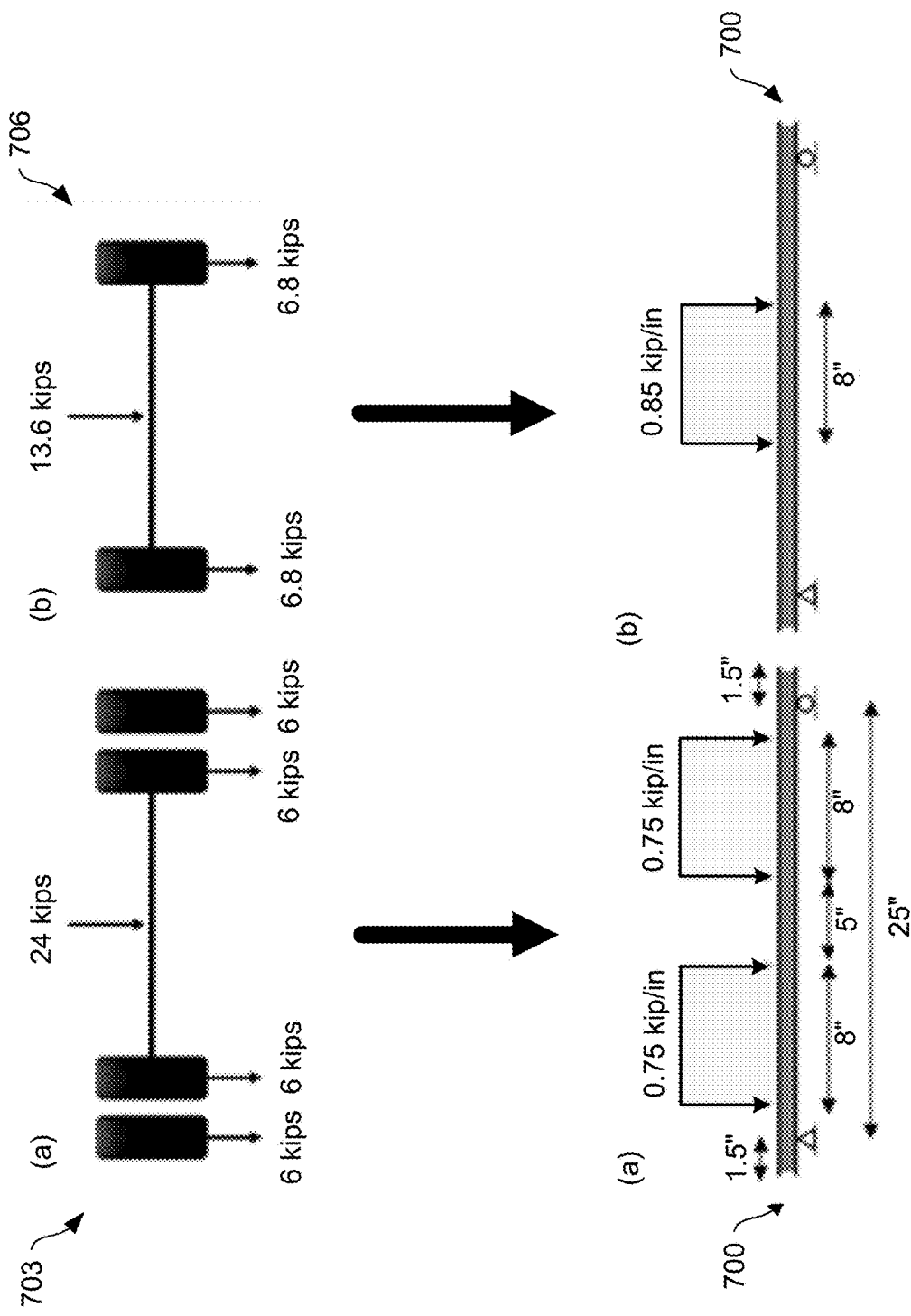
FIG. 7 illustrates top plate design considerations for a self-powered weigh-in-motion system, according to the present disclosure.

FIG. 7 shows an example of a top plate 700 and top plate design considerations for a weigh-in-motion enclosure 503 of a self-powered weigh-in-motion system 100. The dual tire (per side) truck axle 703 can be 24 kips, and the single tire (per side) axle 706 can be 13.6 kips. The top plate 700 can be used for both examples.

The width of the top plate 700 of the weigh-in-motion enclosure 503 perpendicular to the direction of travel can be selected, in one example, as 28 inches in order to cover the right hand side wheel path of a driving lane and accommodate typical dual truck tires and their weaving pattern. The length of top plate 700 in the direction of travel can be 8 inches, which can be sufficient for carrying typical heavy truck tire footprints at load.

A 24 kips truck axle 703 with dual tires and a 13.6 kips axle 706 with single tires can be used to design the thickness of the top plate 700 of the weigh-in-motion enclosure 503. It is noted that the first was purposely selected to be over the legal load limit of 20 kips, to account for the likelihood of overloaded vehicles.

The top plate 700 under such a loading can be analyzed as a supported beam. The support can be provided by the four piezoelectric stacks 103, one located within the weigh-in-motion enclosure 503 and under each of the corners of the top plate 700. The effective width, or span carrying the tire loads, can be 25 inches in this example. The tire footprints can be substantially square-shaped with dimensions of approximately 8×8 inches carrying a uniformly distributed load. The loads can be located mid-span to maximize the stresses for material selection.

In an instance where a (nonlimiting) thickness of 0.75 inches for the top plate 700, the maximum stress under the dual tires and the single tires can be computed as 48 ksi and 47.6 ksi, respectively. These are below the yield stress of the AISI 1018 steel of 57.3 ksi. Any metal, poly, fiberglass, composite, or other material that is capable of handling the stresses can be selected and used for the top plate 700 and the weigh-in-motion enclosure 503.

The corresponding stress on each piezoelectric stack 103 can be 26,843 kPa, which is well below the 940,000 kPa compressive strength of these materials and devices. In some examples, side elements can be bolted to prevent warping. For each post corresponding to each piezoelectric stack 103, special supports can designed to hold the piezoelectric stack 103 in place.

The sensing piezoelectric component 115 of each piezoelectric stack 103 can be placed as the top element of each of the piezoelectric stacks 103. In other words, on top of the energy harvesting piezoelectric component 118. The thickness of the bottom plate can be 0.5 in or another appropriate thickness. The stiffness of the upper plate can also be selected to limit deformation under load to avoid eccentric loading of the stacks supporting the plate under full load and operation.

A piezoelectric sensor model can include a model with frequency dependent $\varphi$ and a model considering $\varphi$ as being frequency independent. Under some testing conditions, the quality of fit of these two models can be similar and effective. This piezoelectric sensor model, after being revised for the actual frequencies applied by the UTM system, can be implemented into a load sensing and classification algorithm of the self-powered weigh-in-motion system 100.

Figure 8:
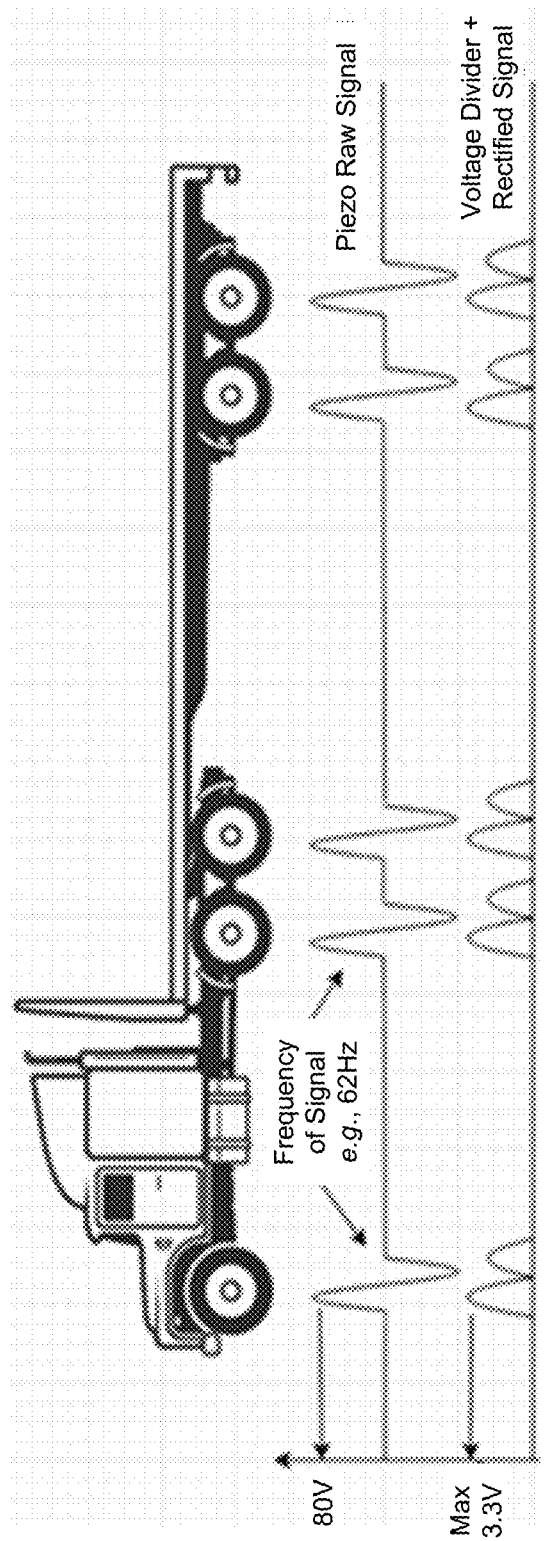
FIG. 8 illustrates an evaluation operation of a self-powered weigh-in-motion system, according to the present disclosure.

FIG. 8 illustrates an evaluation operation of a self-powered weigh-in-motion system 100. FIG. 8 shows an example of signal frequency and voltage in relation to a passing vehicle, as well as the effect of the rectifier circuit 121 and the voltage divider or voltage regulation circuit 124.

The analogue piezoelectric sensor voltage output from the sensing piezoelectric component 115 can be rectified to reverse its negative component, filtered to reduce its noise, and scaled down to the 0 to 3.3 Volt input range of the microcontroller 112. The rectifying and scaling down of the signal is shown schematically in FIG. 8. The raw signal from the passage of an axle can have a positive and a negative component. Its negative component can be reversed to positive using a rectifier circuit 121.

The signal can also be filtered with a filter device using a 3-point moving average to reduce electronic noise. This step may be skipped in some examples such as if the actual microcontroller 112 noise is shown to be negligible. The signal can then be scaled down to the 0 to 3.3 Volt (or another appropriate) range using a voltage divider or voltage regulation circuit 124.

Figure 9A:
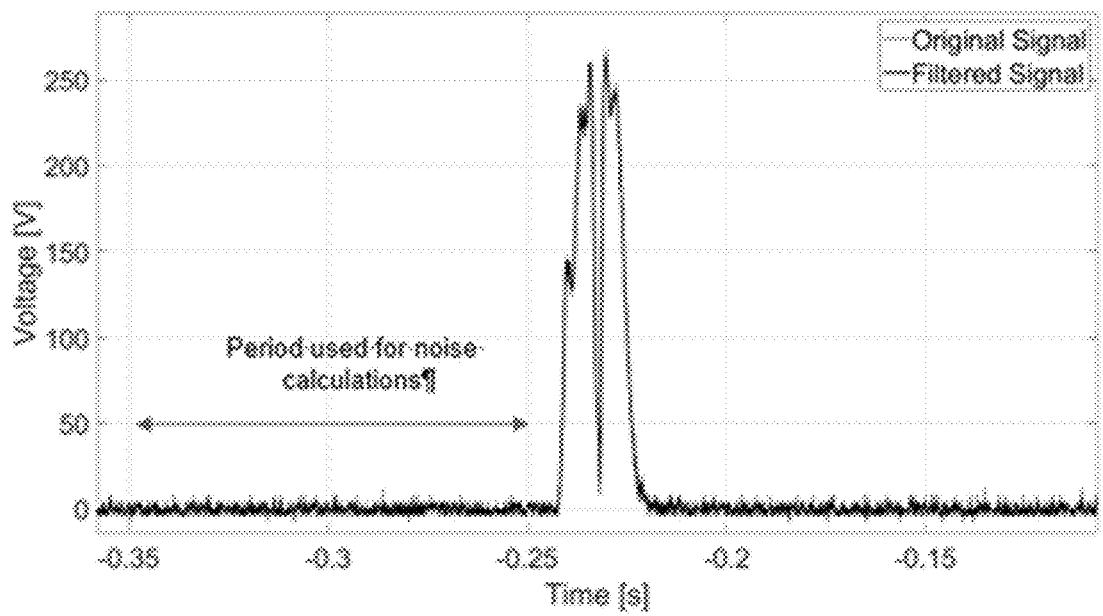
FIGS. 9A-9D illustrate graphs of parameters for a self-powered weigh-in-motion system, according to the present disclosure.

FIG. 9A shows a graph that identifies a period parameter used for noise calculations for the self-powered weigh-in-motion system 100. Filtering can be used to account for the electronic noise level identified for the self-powered weigh-in-motion system 100. After filtering the signal using a 3-point moving average, noise can be analyzed by considering signals over a 0.1 sec period before the load is applied. Post-filtering can generate maximum noise levels of about 8 Volts. As a result, a noise level cutoff can be set at 9 Volts and measurements can be set at a position lower than that level to zero.

TABLE 3

| Noise (Volts) | Average | Standard Deviation | Minimum | Maximum |
|---|---|---|---|---|
| Before Filtering | −0.30 | 3.16 | −8 | 12 |
| After Filtering | −0.30 | 1.83 | −5.33 | 8 |

The processed signal can be scaled down using a voltage divider or another voltage regulation circuit 124. In selecting resistances for a divider, the extreme voltages estimated from the piezoelectric sensor model can be used. These can be estimated for the lightest/slowest tire (i.e., passenger moving at 30 mph) to the heaviest/fastest tire (i.e., overloaded truck moving at 60 mph).

The corresponding loads and frequencies can be 4.4 kN at 33 Hz and 44 kN at 66 Hz and the estimated voltage amplitudes were 58.4 Volts and 1,392 Volts. Scaling down the maximum voltage to 3.3 Volts can include splitting a 450 kΩ resistor into two parts, one 1,066Ω and the other 448,934Ω. These values can be rounded to the nearest commercially available resistor values, while keeping the maximum voltage below 3.3 Volts. Voltage measurements across the smaller resistor can be input into the microcontroller 112.

Figure 9B:
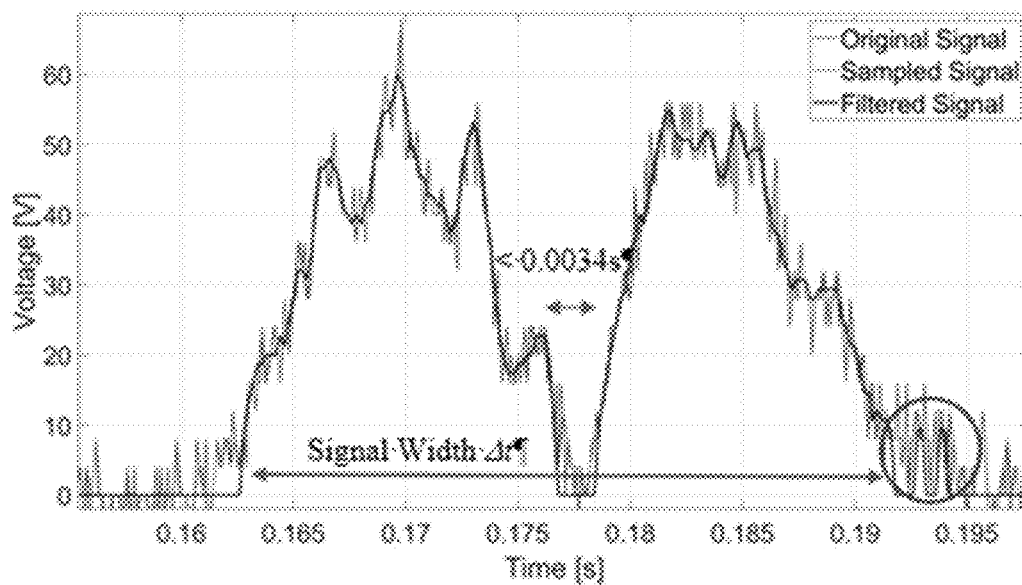
Figure 9C:
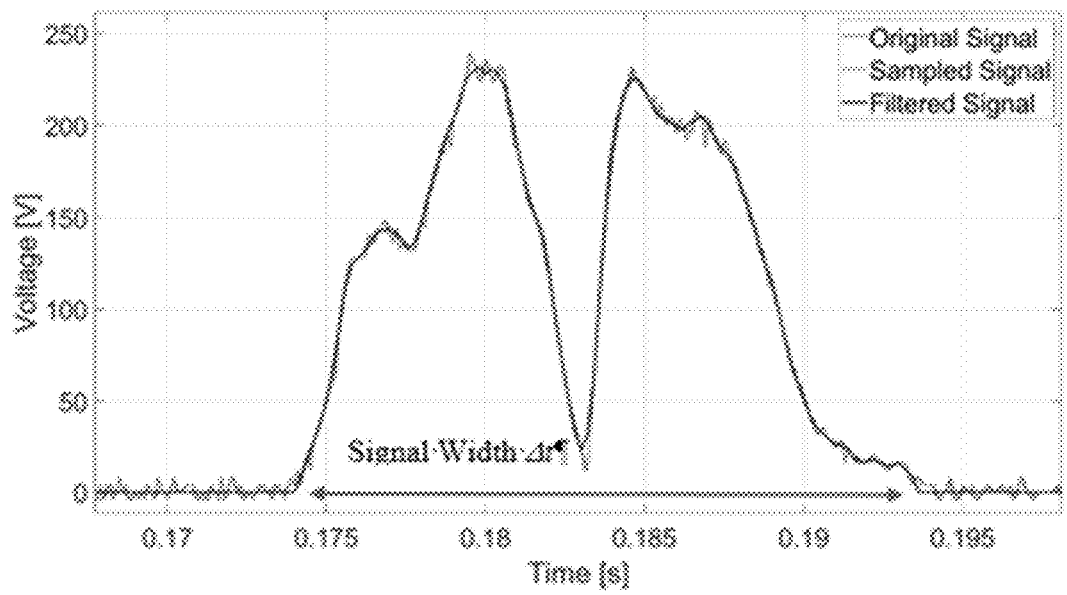

FIGS. 9B and 9C show graphs that identify a signal width Δt used for the self-powered weigh-in-motion system 100. FIGS. 9A and 9B show examples of rectified pulses under a 4.4 kN load at 30 Hz and a 8 kN load at 62 Hz, respectively. These figures also include the simulated sampled signal obtained using a 2.5 kHz sampling frequency and the filtered simulated signal using the 3-point moving average.

The time interval Δt in each figure can be estimated analytically from the full signal width. The beginning and end of the filtered signal can be identified by voltages exceeding zero. For light loads, (i.e., the 4.4 kN applied by car tires), the effect of the noise can be significant and affect the estimation of the Δt and hence, lower the accuracy in predicting frequency and in turn the load as shown in FIG. 9B.

One of the parameters used for estimating tire loads is the loading frequency f, which can be calculated as the inverse of the signal width time duration Δt of the load pulse applied by tires. This in turn is directly related to the vehicle speed and allows estimating axle spacing and hence vehicle classification. Assuming a circular tire footprint of a diameter of 8 inches, Δt is the time it takes for this footprint to traverse the 8-inch long weigh-in-motion enclosure 503 (i.e., a combined distance of 16 inches). For example, a tire travelling at 50 mph (73.33 ft/sec) can take 0.01818 sec to traverse the combined distance of 16 inches in that scenario. This corresponds to a loading frequency f of 55 Hz.

The time it takes for an example microcontroller 112 to "wake up" and begin recording which can be in the order of 15 μs, which allows the self-powered weigh-in-motion system 100 to accurately record the speed of even the first axle of a vehicle after a long time of inaction. This allows the self-powered weigh-in-motion system 100 to "wake up" and detect vehicle speed without resorting to inductive loops, which represents considerable savings over conventional systems.

One consideration in processing the piezoelectric sensor signals for estimating loading frequency and in turn the load is the sampling frequency allowed by the microcontroller 112. The higher the sampling frequency, the higher the memory required for storing the data and consequently, the higher the power requirements for the microcontroller 112.

Another issue related to light loads at low speeds is that the voltage measurements between the two peaks of the rectified and filtered signal generated by a tire may fall below the 9 Volts noise cut off. The algorithm can consider these as a single peak, if the duration of this noise-level voltage is very short. A duration of 0.0034 sec can be identified as the cut off value in FIG. 9B. This value was established experimentally by testing a wide range of tire loads and frequencies. It is noted that this time cutoff is much lower than the time interval between the peaks generated by two closely spaced axles. For example, the time interval between the peaks generated by a set of tandem axles spaced 6 feet apart moving at 30 mph, is 0.106 sec. Hence, the algorithm can differentiate between the pulses generated by single versus double axles even at low speeds.

Processing the data shown in FIGS. 9B and 9C yields Δt values of 0.0292 sec and 0.0196 sec, which translate to loading frequencies of 34.24 Hz and 51 Hz, respectively. The differences between nominal and actual frequencies can be established by two methods. First, manually by estimating the Δt of pulses from the oscilloscope readings and second by the algorithm developed. As the loads applied are increased, the actual frequencies applied testing are gradually reduced. This is one limitation of servo-hydraulic testing systems and can be corrected by updated algorithms. The discrepancy between nominal and actual loading frequencies discussed above necessitated refitting the electromechanical models of the 4 piezoelectric sensor elements using the actual loading frequencies applied. The corresponding fitted constants, namely $R_{em}$ and $L_{em}$, and φ can be 13.009 Ω, 0.033 H, and 0.55, respectively.

Figure 9D:
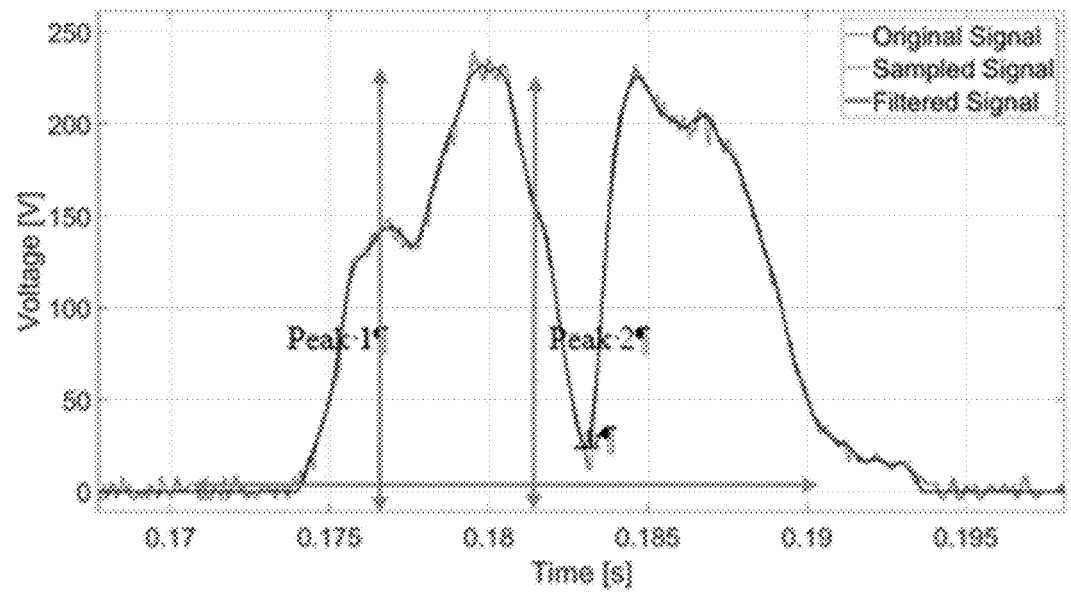

FIG. 9D shows a graph that identifies the voltage output of two peaks of a signal. The average value of these parameters can be used for vehicle classification. The algorithm for tire load estimation can analyze the rectified, filtered and scaled-down voltage output of the four sensing piezoelectric components 115 connected in parallel. It computes the average value of the voltage output of the two peaks of the signal, as shown.

Figure 10:
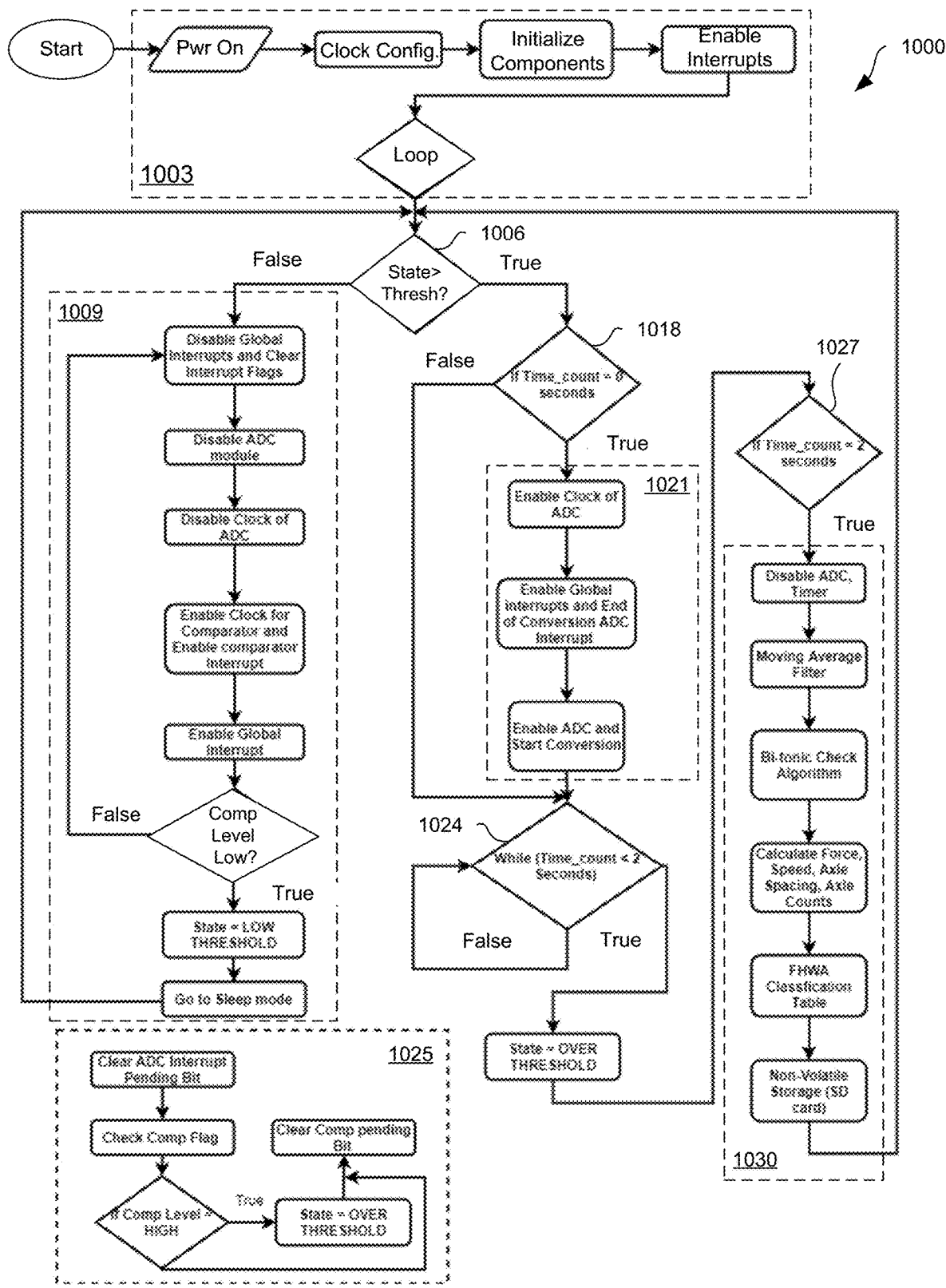
FIG. 10 illustrates an example flowchart that describes operations of a self-powered weigh-in-motion system, according to the present disclosure.

FIG. 10 illustrates an example flowchart 1000 that describes operations of a self-powered weigh-in-motion system 100. The flowchart 1000 can implement an algorithm for tire load estimation and vehicle classification. A vehicle classification algorithm can be implemented that is based on axle spacings and axle loads. Vehicle classification algorithm takes into account the:

Number of axles on the vehicle.
Spacing between those axles.
Weight of the first axle on the vehicle.
Gross vehicle weight of the vehicle.

This can be considered to more accurate than a simpler classification scheme that relies only on axle spacing because it can differentiate between classes of vehicles with similar axle space "signatures" (e.g., a pickup truck towing a boat trailer and a truck with 4 axles).

TABLE 4

| | | | Vehicle Classification Information | | | | |
|---|---|---|---|---|---|---|---|
| Vehicle Class | Type | No. of Axles | Spacing (ft) for: Axles [1-2] | [2-3] | [3-4] | [4-5] | [5-6] |
| 1 | Motorcycle | 2 | 1.00-5.99 | — | — | — | — |
| 2 | Passenger Car | | 6.00-10.10 | — | — | — | — |

TABLE 4-continued

Vehicle Classification Information

| | | | | | | | |
|---|---|---|---|---|---|---|---|
| 3 | Other (Pickup/Van) | | 10.11-23.09 | — | — | — | — |
| 4 | Bus | | 23.10-40.00 | — | — | — | — |
| 5 | 2D Single Unit | | 6.00-23.09 | — | — | — | — |
| 2 | Car with 1 Axle Trailer | 3 | 6.00-10.10 | 6.00-25.00 | — | — | — |
| 3 | Other with 1-Axle Trailer | | 10.11-23.09 | 6.00-25.00 | — | — | — |
| 4 | Bus | | 23.10-40.00 | 3.00-7.00 | — | — | — |
| 5 | 2D with 1-Axle Trailer | | 6.00-23.09 | 6.30-30.00 | — | — | — |
| 6 | 3-Axle Single Unit | | 6.00-23.09 | 2.50-6.29 | — | — | — |
| 8 | Semi, 2S1 | | 6.00-23.09 | 11.00-45.00 | — | — | — |
| 2 | Car with 2-Axle Trailer | 4 | 6.00-10.10 | 6.00-30.00 | 1.00-11.99 | — | — |
| 3 | Other with 2-Axle Tr. | | 10.11-23.09 | 6.00-30.00 | 1.00-11.99 | — | — |
| 5 | 2D with 2-Axle Trailer | | 6.00-26.00 | 6.30-40.00 | 1.00-20.00 | — | — |
| 7 | 4-Axle Single Unit | | 6.00-23.09 | 2.50-6.29 | 2.50-12.99 | — | — |
| 8 | Semi, 3S1 | | 6.00-26.00 | 2.50-6.29 | 13.00-50.00 | — | — |
| 8 | Semi, 2S2 | | 6.00-26.00 | 8.00-45.00 | 2.50-20.00 | — | — |
| 3 | Other with 3-Axle Trailer | 5 | 10.11-23.09 | 6.00-25.00 | 1.00-11.99 | 1.00-11.99 | — |
| 5 | 2D with 3 Axle Trailer | | 6.00-23.09 | 6.30-35.00 | 1.00-25.00 | 1.00-11.99 | — |
| 7 | 5-Axle Single Unit | | 6.00-23.09 | 2.50-6.29 | 2.50-6.29 | 2.50-6.30 | — |
| 9 | Semi, 3S2 | | 6.00-30.00 | 2.50-6.29 | 6.30-65.00 | 2.50-11.99 | — |
| 9 | Truck + Full Tr. (3-2) | | 6.00-30.00 | 2.50-6.29 | 6.30-50.00 | 12.00-27.00 | — |
| 9 | Semi, 2S3 | | 6.00-30.00 | 16.00-45.00 | 2.50-6.30 | 2.50-6.30 | — |
| 11 | Semi + Full Trailer, 2S12 | | 6.00-30.00 | 11.00-26.00 | 6.00-20.00 | 11.00-26.00 | — |
| 10 | Semi, 3S3 | 6 | 6.00-26.00 | 2.50-6.30 | 6.10-50.00 | 2.50-11.99 | 2.50-10.99 |
| 12 | Semi + Full Trailer, 3S12 | | 6.00-26.00 | 2.50-6.30 | 11.00-26.00 | 6.00-24.00 | 11.00-26.00 |
| 13 | 7-Axle Multi-trailers | 7 | 6.00-45.00 | 3.00-45.00 | 3.00-45.00 | 3.00-45.00 | 3.00-45.00 |
| 13 | 8-Axle Multi-trailers | 8 | 6.00-45.00 | 3.00-45.00 | 3.00-45.00 | 3.00-45.00 | 3.00-45.00 |
| 13 | 9-Axle Multi-trailer | 9 | 6.00-45.00 | 3.00-45.00 | 3.00-45.00 | 3.00-45.00 | 3.00-45.00 |

| Class | [6-7] | [7-8] | [8-9] | GVW Min-Max (Kips) | Axle 1 Weight Min(Kips)[1] |
|---|---|---|---|---|---|
| 1 | — | — | — | 0.10-3.00 | — |
| 2 | — | — | — | 1.00-7.99 | — |
| 3 | — | — | — | 1.00-7.99 | — |
| 4 | — | — | — | 12.00> | — |
| 5 | — | — | — | 8.00> | 2.5 |
| 2 | — | — | — | 1.00-11.99 | — |
| 3 | — | — | — | 1.00-11.99 | — |
| 4 | — | — | — | 20.00> | — |
| 5 | — | — | — | 12.00-19.99 | 2.5 |
| 6 | — | — | — | 12.00> | 3.5 |
| 8 | — | — | — | 20.00> | 3.5 |
| 2 | — | — | — | 1.00-11.99 | — |
| 3 | — | — | — | 1.00-11.99 | — |
| 5 | — | — | — | 12.00-19.99 | 2.5 |
| 7 | — | — | — | 12.00> | 3.5 |
| 8 | — | — | — | 20.00> | 5.0 |
| 8 | — | — | — | 20.00> | 3.5 |
| 3 | — | — | — | 1.00-11.99 | — |
| 5 | — | — | — | 12.00-19.99 | 2.5 |
| 7 | — | — | — | 12.00> | 3.5 |
| 9 | — | — | — | 20.00> | 5.0 |
| 9 | — | — | — | 20.00> | 3.5 |
| 9 | — | — | — | 20.00> | 3.5 |
| 11 | — | — | — | 20.00> | 3.5 |
| 10 | — | — | — | 20.00> | 5.0 |
| 12 | — | — | — | 20.00> | 5.0 |
| 13 | 3.00-45.00 | — | — | 20.00> | 5.0 |

TABLE 4-continued

Vehicle Classification Information

| | | | | | |
|---|---|---|---|---|---|
| 13 | 3.00-45.00 | 3.00-45.00 | — | 20.00> | 5.0 |
| 13 | 3.00-45.00 | 3.00-45.00 | 3.00-45.00 | 20.00> | 5.0 |

A vehicle classification algorithm that can be implemented is based on axle spacings and axle loads. Vehicle classification algorithm takes into account the various information including weigh-in-motion data and other information as discussed herein.

Weigh-in-motion data can be stored in a Secure Digital (SD) memory card or any computer readable memory. The data can be formatted using the standardized "W-record" format. This is the format used by most commercial WIM systems. It includes the number, spacing, and weight of axles by vehicle, as well as vehicle class and GVW. The length of the data corresponding to individual vehicles is defined by the number of axles per vehicle. The maximum record size is 268 columns that can accommodate a 25 axle vehicle. Using the 16 MB internal memory of the MCU and 4 byte sized columns, data from a total of 60,000 individual vehicles can be stored.

TABLE 5

Standardized Vehicle W-Record Format

| Field | Columns | Width | Description |
|---|---|---|---|
| 1 | 1 | 1 | Record Type |
| 2 | 2-3 | 2 | FIPS State Code |
| 3 | 4-9 | 6 | Station ID |
| 4 | 10 | 1 | Direction of Travel code |
| 5 | 11 | 1 | Lane of Travel |
| 6 | 12-15 | 4 | Year of Data |
| 7 | 16-17 | 2 | Month of Data |
| 8 | 18-19 | 2 | Day of Data |
| 9 | 20-27 | 8 | Time of Data |
| 10 | 28 | 1 | W |
| 11 | 29-32 | 4 | Vehicle Signature/Other Use |
| 12 | 33-36 | 4 | Vehicle Speed |
| 13 | 37-38 | 2 | Vehicle Classification |
| 14 | 39-40 | 2 | Number of Axles |
| 15 | 41-44 | 4 | Total Vehicle Length (bumper to bumper) |
| 16 | 45-47 | 3 | Pavement Temperature |
| 17 | 48-52 | 5 | Axle Weight 1 |
| 18 | 53-56 | 4 | Axles 1-2 Spacing |
| 19 | 57-61 | 5 | Axle Weight 2 |
| 20 | 62-65 | 4 | Axles 2-3 Spacing |
| 21 | 66-70 | 5 | Axle Weight 3 |
| 22 | 71-74 | 4 | Axles 3-4 Spacing |
| . | . | . | . |
| . | . | . | . |
| . | . | . | . |
| 38 | 143-146 | 4 | Axles 11-12 Spacing |
| 39 | 147-151 | 5 | Axle Weight 12 |
| 40+ | Additional spaces in 4-digit incr. up to 25 axles | | |
| 41+ | Additional weights in 5-digit incr. up to 25 axles | | |

The algorithm for tire load estimation can analyze the rectified, filtered and scaled-down voltage output of the four sensing piezoelectric components 115 connected in parallel. It computes the average value of the voltage output of the two peaks of the signal, as for example, shown in FIG. 9D.

The average value and the actual frequency estimated from the time interval Δt are entered into the piezoelectric sensor model fitted and the tire load estimated can be doubled to compute the axle load. Axle spacing can be computed from the time interval between the beginning of the pulse and the next one. A 2 sec headway or other selected time between successive vehicles can be used for the purpose of separating the output from successive vehicles. This can be the typical minimum time interval between successive vehicles. In addition, it allows capturing extremely long vehicles that move slowly.

For example, a triple-trailer truck with a wheelbase of 24.4 m (80 ft) traveling at 43 km/hr (26 mph) can take about 2 seconds to traverse the PEH harvester. In effect, the system records voltage versus time data for a period of 2 seconds, analyzes and stores the weigh-in-motion data, and then clears the memory. This traffic stream property allows separating vehicles without using inductive loops, which represents a significant innovation compared to conventional weigh-in-motion systems.

Generally, the flowchart 1000 can implement the algorithm to:

1. Read the voltage signal values and the corresponding time.
2. Store the data in two arrays, "voltage" array and "time" array. The time interval between successive voltage readings can be defined according to the sampling frequency of the microcontroller 112 used (e.g., 1,200 Hz, 2,500 Hz, etc.). Hence, the number of voltage readings corresponds to the time within the 2 sec or other interval allotted to each vehicle for the particular system.
3. Filter the voltage array using a 3-point moving average.
4. Set to zero any voltage values lower than the noise level (i.e., 9 Volts for the oscilloscope).
5. Identify the points in time when the voltage begins to be larger than zero and store them in the "sarr" array. Then, identify the points in time when the voltage goes back to zero and store them in the "earr" array. These numbers are checked to make sure they satisfy two conditions. First, that the duration between two consecutive start and end points (i.e., pulse width) is longer than 0.004 s. Second, check that the time elapsed between two consecutive "sarr" and "earr" pairs is shorter than 0.0034 sec (i.e., this identifies inter-pulse noise). The finalized starting and ending points are indexed as "sarr(i)" and "earr(i)", respectively.
6. Compute the number of axles per vehicle from the counter "i" in the "sarr(i)" array.
7. Analyze each signal and compute the corresponding number of voltage data points by computing the corresponding "earr(i)" minus sarr(i)". Take the average of each resulted value and multiply it by the sampling the interval to compute the average signal width of all vehicle axles and invert it to calculate the loading frequency. A variation of this algorithm was developed to allow for faster processing, whereby frequency was sensed using the data from the $2^{nd}$ axle only.
8. Use the "sarr" and "earr" arrays for computing the highest maximum points between the first half portion of each signal and the second half of each signal. Compute the average of these two voltage peaks for each axle.
9. Use the loading frequency and the voltage amplitude computed as input to one of the electromechanical models fitted (i.e., either Models 1, 2 or 3) to compute the tire load and multiply it by 2 to obtain the axle load.
10. Use the frequency to estimate the vehicle speed and use the time difference between each consecutive ending point stored in "earr(i)" to compute the axle spacings.
11. Use the vehicle classification algorithm to obtain the class of each vehicle.
12. Store the data in the standardized format.

The flowchart 1000 shows a number of steps. The steps can refer to one or more actions or functionalities performed using various hardware and software components of the self-powered weigh-in-motion system 100. The steps can also include a method performed by various hardware and software components of the self-powered weigh-in-motion system 100.

In step 1003, the self-powered weigh-in-motion system 100 can perform an initialization sequence 1003. The initialization sequence 1003 can include powering on of one or more components and subcomponents of the self-powered weigh-in-motion system 100. The initialization sequence 1003 can include a clock configuration, including setting a time of a clock, a format of a clock, a time zone of a clock, as well as other clock configurations. The microcontroller 112 can include one or more clocks that can be used for various modules or functionalities of the microcontroller 112. The clocks can be considered part of the module or can be a separate clock that is logically associated with the module by the microcontroller 112. The initialization sequence 1003 can include initialization of a number of components including the clock, a timer or counter, an analog to digital converter, and comparator modules that compare various values discussed to thresholds. The thresholds can include voltage level thresholds, time thresholds, and others. The initialization sequence 1003 can include enabling interrupts for the various components and subcomponents of the self-powered weigh-in-motion system 100.

In step 1006, the self-powered weigh-in-motion system 100 can determine whether a state measured by the self-powered weigh-in-motion system 100 crosses a preterminal threshold. In some examples, the self-powered weigh-in-motion system 100 can wake up in response to a change of state or a state exceeding a preterminal wake up threshold or another threshold. The threshold can be a threshold that indicates that a vehicle has crossed over one or more piezoelectric stacks 103, for example, in a weigh-in-motion enclosure 503 of the self-powered weigh-in-motion system 100. The state can be a value or voltage originating from a sensing piezoelectric component 115 and an energy harvesting piezoelectric component 118, and in some cases passing through and processed using other components of the self-powered weigh-in-motion system 100. If the state has not crossed the threshold, the self-powered weigh-in-motion system 100 can move to step 1009 and ultimately determine whether to enter a sleep mode. If the state crosses the threshold, the self-powered weigh-in-motion system 100 can move to step 1018.

In step 1009, the self-powered weigh-in-motion system 100 can perform a sleep initialization sequence. The sleep initialization sequence can include disabling interrupts and clearing interrupt flags, disabling an ADC module, disabling a clock of the ADC module, enabling a clock for a comparator, enabling a comparator interrupt, and then enabling a global interrupt. The self-powered weigh-in-motion system 100 can determine whether the comparator level is low based on the threshold. If not, the process can loop back. However, if the comparator level is low relative to the threshold value, then the self-powered weigh-in-motion system 100 can enable a sleep mode. The sleep mode can include a lower power mode where power consumption is lower than a general operation or awake mode of the self-powered weigh-in-motion system 100.

In step 1018, if the state measured in step 1006 is above a threshold value, then the self-powered weigh-in-motion system 100 can check whether a timer is at 0. If the timer is at zero, the process moves to step 1021. This can indicate that a new vehicle is being measured, and a timer should be initialized and count to a predetermined time threshold. Otherwise step 1021 can be skipped, for example, because a vehicle is already being monitored within the predetermined time threshold (e.g., 2 seconds).

In step 1021, the self-powered weigh-in-motion system 100 can enable a clock of the ADC module of the microcontroller 112. The self-powered weigh-in-motion system 100 can also enable global interrupts and an 'end of conversion' ADC interrupt. The self-powered weigh-in-motion system 100 can then enable the ADC and start conversion and recording or storing of voltage levels converted and stored as digital values. The digital values can be time-stamped or can be stored at a known interval that can be used to plot or graph these values over time.

In step 1024, the self-powered weigh-in-motion system 100 can continue the ADC operation until the timer or clock counts to the predetermined time threshold. In step 1025, the self-powered weigh-in-motion system 100 can clear the ADC interrupt pending bit, and then check a comparator flag. If the comparator level is high, then the time state is over the predetermined time threshold. The comparator pending bit is cleared, and the process can move to step 1030. In some examples, the ADC can process bits until the time state is over the predetermined time threshold as indicated in step 1025.

In step 1027, once the timer or clock counts to the predetermined time threshold, the self-powered weigh-in-motion system 100 can move to step 1030. Otherwise, the ADC process can continue.

In step 1030, the self-powered weigh-in-motion system 100 can identify a vehicle classification using the digital values recorded or within the predetermined time threshold. These values can be stored in volatile or nonvolatile memory of the microcontroller 112 or another component of the self-powered weigh-in-motion system 100. The self-powered weigh-in-motion system 100 can disable the ADC and the timer of the microcontroller 112. The self-powered weigh-in-motion system 100 can apply a moving average filter to the digital values recorded or within the predetermined time threshold. These digital values can be values associated with a particular vehicle that has crossed the self-powered weigh-in-motion system 100. A sorting algorithm such as a bitonic mergesort algorithm can be used to process the values for the vehicle.

The self-powered weigh-in-motion system 100 can generate vehicle data based on the digital values for the vehicle. The vehicle data can include force, speed, axle spacing, and axle count for the vehicle. The self-powered weigh-in-motion system 100 can calculate this information and provide it as inputs to an algorithm that determines a vehicle classification by comparing the data to the classification data indicated in a vehicle classification table. The vehicle classification, as well as the other data, can be stored along with a timestamp. The data can be stored in non-volatile memory such as an SD card or another nonvolatile storage medium.

Among embodiments, some aspects of the present disclosure are implemented by a computer program executed by one or more processors, as described, and illustrated. As would be apparent to one having ordinary skill in the art, one or more embodiments may be implemented, at least in part, by computer-readable instructions in various forms, and the present disclosure is not intended to be limiting to a particular set or sequence of instructions executed by the processor.

A number of software components are stored in the memory and executable by a processor. In this respect, the term "executable" means a program file that is in a form that can ultimately be run by the processor. Examples of executable programs can be, for example, a compiled program that can be translated into machine code in a format that can be loaded into a random access portion of one or more of the memory devices and run by the processor, code that can be expressed in a format such as object code that is capable of being loaded into a random access portion of the one or more memory devices and executed by the processor, or code that can be interpreted by another executable program to generate instructions in a random access portion of the memory devices to be executed by the processor. An executable program can be stored in any portion or component of the memory devices including, for example, random access memory (RAM), read-only memory (ROM), hard drive, solid-state drive, USB flash drive, memory card, optical disc such as compact disc (CD) or digital versatile disc (DVD), floppy disk, magnetic tape, or other memory components.

Memory devices can include both volatile and nonvolatile memory and data storage components. Also, a processor can represent multiple processors and/or multiple processor cores, and the one or more memory devices can represent multiple memories that operate in parallel processing circuits, respectively. Memory devices can also represent a combination of various types of storage devices, such as RAM, mass storage devices, flash memory, or hard disk storage. In such a case, a local interface can be an appropriate network that facilitates communication between any two of the multiple processors or between any processor and any of the memory devices. The local interface can include additional systems designed to coordinate this communication, including, for example, performing load balancing. The processor can be of electrical or of some other available construction.

Although the various services and functions described herein can be embodied in software or code executed by general purpose hardware as discussed above, as an alternative, the same can also be embodied in dedicated hardware or a combination of software/general purpose hardware and dedicated hardware. If embodied in dedicated hardware, each can be implemented as a circuit or state machine that employs any one of or a combination of a number of technologies. These technologies can include discrete logic circuits having logic gates for implementing various logic functions upon an application of one or more data signals, application specific integrated circuits (ASICs) having appropriate logic gates, field-programmable gate arrays (FPGAs), or other components.

The sequence diagrams and flowcharts can show examples of the functionality and operation of an implementation of portions of components described herein. If embodied in software, each block can represent a module, segment, or portion of code that can include program instructions to implement the specified logical function(s). The program instructions can be embodied in the form of source code that can include human-readable statements written in a programming language or machine code that can include numerical instructions recognizable by a suitable execution system such as a processor in a computer system or another system. The machine code can be converted from the source code. If embodied in hardware, each block can represent a circuit or a number of interconnected circuits to implement the specified logical function(s).

Although sequence diagrams and flowcharts can be shown in a specific order of execution, it is understood that the order of execution can differ from that which is depicted. For example, the order of execution of two or more blocks can be scrambled relative to the order shown. Also, two or more blocks shown in succession can be executed concurrently or with partial concurrence. Further, in some embodiments, one or more of the blocks shown in the drawings can be skipped or omitted.

Also, any logic or application described herein that includes software or code can be embodied in any non-transitory computer-readable medium for use by or in connection with an instruction execution system such as a processor in a computer system or another system. In this sense, the logic can include, for example, statements including instructions and declarations that can be fetched from the computer-readable medium and executed by the instruction execution system. In the context of the present disclosure, a "computer-readable medium" can be any medium that can contain, store, or maintain the logic or application described herein for use by or in connection with the instruction execution system.

The computer-readable medium can include any one of many physical media, such as magnetic, optical, or semiconductor media. More specific examples of a suitable computer-readable medium include solid-state drives or flash memory. Further, any logic or application described herein can be implemented and structured in a variety of ways. For example, one or more applications can be implemented as modules or components of a single application. Further, one or more applications described herein can be executed in shared or separate computing devices or a combination thereof. For example, a plurality of the applications described herein can execute in the same computing device, or in multiple computing devices.

It is emphasized that the above-described embodiments of the present disclosure are merely possible examples of implementations described for a clear understanding of the principles of the disclosure. Many variations and modifications can be made to the above-described embodiments without departing substantially from the spirit and principles of the disclosure. All such modifications and variations are intended to be included in the following claims herein, within the scope of this disclosure.

The embodiments described herein are not limited in application to the details set forth in the following description or illustrated in the drawings. The disclosed subject matter is capable of other embodiments and of being practiced or carried out in various ways. Also, the phraseology and terminology used herein is for the purpose of description and should not be regarded as limiting. The use of "including," "comprising," or "having" and variations thereof herein is meant to encompass the items listed thereafter, additional items, and equivalents thereof. The terms "connected" and "coupled" are used broadly and encompass both direct and indirect connections and couplings. In addition, the terms "connected" and "coupled" are not limited to electrical, physical, or mechanical connections or couplings. As used herein the terms "machine," "computer," "server," and "work station" are not limited to a device with a single processor, but may encompass multiple devices (e.g., computers and servers) linked in a system, devices with multiple processors, special purpose devices, devices with various peripherals and input and output devices, software acting as a computer or server, and combinations of the above.

Although embodiments are described herein in detail, the descriptions are by way of example. The features of the embodiments described herein are representative and, in alternative embodiments, certain features and elements may be added or omitted. Additionally, modifications to aspects of the embodiments described herein may be made by those skilled in the art without departing from the spirit and scope of the present disclosure defined in the following claims, the scope of which are to be accorded the broadest interpretation so as to encompass modifications and equivalent structures.

Therefore, at least the following is claimed:

1. A weigh-in-motion system comprising:
an enclosure comprising a top plate installed flush with a pavement;
a microcontroller unit within the enclosure; and
a plurality of piezoelectric stacks, a respective one of the piezoelectric stacks comprising:
a sensing piezoelectric component that is communicatively connected to a data input of the microcontroller unit as a sensor for at least one moving vehicular load; and
an energy harvesting piezoelectric component that generates energy based on the at least one moving vehicular load and is connected to a power input of the microcontroller unit; and
wherein the microcontroller unit analyzes sensor data from at least one of the plurality of piezoelectric stacks to generate vehicle classification data that describes the at least one moving vehicular load.

2. The system of claim 1, wherein the vehicle classification data comprises at least one of a vehicle speed, an axle load, a number of axles, an axle spacing, and a vehicle classification.

3. The system of claim 1, wherein a plurality of sensing piezoelectric components are connected in parallel, the plurality of sensing piezoelectric components corresponding to the plurality of piezoelectric stacks.

4. The system of claim 1, wherein the energy harvesting piezoelectric component comprises a plurality of parallel piezoelectric elements or a plurality of parallel piezoelectric disks.

5. The system of claim 1, wherein a plurality of energy harvesting piezoelectric components are connected in parallel, the plurality of energy harvesting piezoelectric components corresponding to the plurality of piezoelectric stacks.

6. The system of claim 1, wherein the respective one of the piezoelectric stacks is located at a corresponding corner of the top plate.

7. The system of claim 1, further comprising:
a sensing data processing circuit comprising: a diode rectifier, and a voltage divider, wherein the sensing piezoelectric component is communicatively connected to the data input of the microcontroller unit through the sensing data processing circuit.

8. A system comprising:
a microcontroller unit that analyzes sensor data from a sensing piezoelectric component to generate vehicle classification data that describes at least one moving vehicular load; and
a piezoelectric stack, comprising:
the sensing piezoelectric component that acts as a sensor for the at least one moving vehicular load, wherein the sensing piezoelectric component is communicatively connected to a data input of the microcontroller unit; and
an energy harvesting piezoelectric component that generates energy based on the at least one moving vehicular load and is connected to a power input of the microcontroller unit.

9. The system of claim 8, wherein the vehicle classification data comprises at least one of a vehicle speed, an axle load, a number of axles, an axle spacing, and a vehicle classification.

10. The system of claim 8, wherein the sensing piezoelectric component is connected in parallel with a plurality of sensing piezoelectric components corresponding to a plurality of additional piezoelectric stacks.

11. The system of claim 8, wherein the energy harvesting piezoelectric component comprises a plurality of parallel piezoelectric elements or a plurality of parallel piezoelectric disks.

12. The system of claim 8, wherein the energy harvesting piezoelectric component is connected in parallel with a plurality of energy harvesting piezoelectric components corresponding to a plurality of additional piezoelectric stacks.

13. The system of claim 8, further comprising:
an energy harvesting circuit comprising: a diode rectifier, a flyback direct current (DC) to DC converter, a battery management component, and a battery component comprising at least one battery, wherein the energy harvesting piezoelectric component is communicatively connected to the power input of the microcontroller unit through the diode rectifier and the flyback DC to DC converter of the energy harvesting circuit.

14. The system of claim 8, further comprising:
a sensing data processing circuit comprising: a diode rectifier, and a voltage divider, wherein the sensing piezoelectric component is communicatively connected to the data input of the microcontroller unit through the sensing data processing circuit.

15. An apparatus comprising:
a plurality of piezoelectric stacks, a respective one of the piezoelectric stacks comprising:
a sensing piezoelectric component that acts as a sensor for at least one moving vehicular load; and
an energy harvesting piezoelectric component that generates energy based on the at least one moving vehicular load; and
a computing device that analyzes sensor data from the sensing piezoelectric component and generates vehicle classification data that describes the at least one moving vehicular load, wherein the computing device is powered at least in part by the energy generated by the energy harvesting piezoelectric component.

16. The apparatus of claim 15, wherein the vehicle classification data comprises at least one of a vehicle speed, an axle load, a number of axles, an axle spacing, and a vehicle classification.

17. The apparatus of claim 15, wherein a plurality of sensing piezoelectric components are connected in parallel, and the plurality of sensing piezoelectric components correspond to the plurality of piezoelectric stacks.

18. The apparatus of claim 15, wherein the energy harvesting piezoelectric component comprises a plurality of parallel piezoelectric elements or a plurality of parallel piezoelectric disks.

19. The apparatus of claim 15, wherein a plurality of energy harvesting piezoelectric components are connected in parallel, the plurality of energy harvesting piezoelectric components corresponding to the plurality of piezoelectric stacks.

20. The apparatus of claim 15, further comprising:
a sensing data processing circuit comprising: a diode rectifier, and a voltage divider, wherein the sensing piezoelectric component is communicatively connected to the data input of the microcontroller unit through the sensing data processing circuit.

* * * * *